(12) United States Patent
Whiteford et al.

(10) Patent No.: US 12,055,590 B2
(45) Date of Patent: Aug. 6, 2024

(54) SYSTEM, APPARATUS, AND METHOD FOR TESTING OF AN ELECTRICAL SYSTEM

(71) Applicant: OneStep Power Solutions Inc., Houston, TX (US)

(72) Inventors: Sarah Whiteford, Houston, TX (US); Mark Craig, Houston, TX (US); Dairon Campos Dominguez, Houston, TX (US)

(73) Assignee: OneStep Power Solutions Inc., Houston, TX (US)

(*) Notice: Subject to any disclaimer, the term of this patent is extended or adjusted under 35 U.S.C. 154(b) by 177 days.

(21) Appl. No.: 18/051,576

(22) Filed: Nov. 1, 2022

(65) Prior Publication Data

US 2023/0133042 A1 May 4, 2023

Related U.S. Application Data

(60) Provisional application No. 63/414,301, filed on Oct. 7, 2022, provisional application No. 63/414,310, filed
(Continued)

(51) Int. Cl.
*G01R 31/34* (2020.01)
*G01R 31/28* (2006.01)
(Continued)

(52) U.S. Cl.
CPC ....... *G01R 31/343* (2013.01); *G01R 31/2848* (2013.01); *G01R 31/52* (2020.01);
(Continued)

(58) Field of Classification Search
CPC .. G01R 31/343; G01R 31/2848; G01R 31/56; G01R 31/52; H02J 3/381; H02J 2203/20
(Continued)

(56) References Cited

U.S. PATENT DOCUMENTS

| | | | |
|---|---|---|---|
| 2006/0267560 A1 | 11/2006 | Rajda et al. | |
| 2007/0085424 A1* | 4/2007 | Scharnick | G05B 9/02 307/326 |

(Continued)

FOREIGN PATENT DOCUMENTS

EP 2433355 7/2014

OTHER PUBLICATIONS

International Search Report and Written Opinion, issued on PCT Patent Application No. PCT/US2022/079053, dated Mar. 16, 2023.

*Primary Examiner* — Raul J Rios Russo
(74) *Attorney, Agent, or Firm* — McCarter & English, LLP; James M. Smedley; Alex Korona

(57) ABSTRACT

A method for a fault ride through testing of an electrical system including one or more power sources, one or more power consumers, and a first protective-isolation device and a second protective-isolation device both disposed between the one or more power sources and the one or more power consumers is disclosed. The method includes prior to the fault ride through testing, opening the second protective-isolation device, and closing the first protective-isolation device, and during the fault ride through testing, opening both the first and second protective-isolation devices to block current flow between the one or more power sources and the one or more power consumers. The method also includes during the fault ride through testing, decreasing a terminal voltage of the one or more power sources using a voltage regulator, and following the fault ride through testing, opening the first protective-isolation device, and closing the second protective-isolation device.

20 Claims, 13 Drawing Sheets

Related U.S. Application Data on Oct. 7, 2022, provisional application No. 63/274,726, filed on Nov. 2, 2021.

(51) Int. Cl.
  *G01R 31/52* (2020.01)
  *G01R 31/56* (2020.01)
  *H02J 3/38* (2006.01)

(52) U.S. Cl.
  CPC .............. *G01R 31/56* (2020.01); *H02J 3/381* (2013.01); *H02J 2203/20* (2020.01)

(58) Field of Classification Search
  USPC ..................................................... 324/765.01
  See application file for complete search history.

(56) References Cited

U.S. PATENT DOCUMENTS

| | | |
|---|---|---|
| 2008/0018309 A1 | 1/2008 | Erdman et al. |
| 2008/0266740 A1* | 10/2008 | Smith ..................... H02M 1/32 |
| | | 323/283 |
| 2009/0079266 A1* | 3/2009 | McNamara ............. H02J 3/007 |
| | | 307/64 |
| 2010/0284117 A1 | 11/2010 | Crane |
| 2011/0057444 A1 | 3/2011 | Dai et al. |
| 2012/0173035 A1 | 7/2012 | Abe |
| 2013/0270902 A1 | 10/2013 | Andersen et al. |
| 2017/0146603 A1 | 5/2017 | Qin et al. |

* cited by examiner

FIG. 7A
| | Before Test | Initiate Test | End Test |
|---|---|---|---|
| DG1 | 0 | 0 | 0 |
| DG2 | 0 | 0 | 0 |
| DG3 | 0 | 0 | 1 |
| DG4 | 1 | 0 | 0 |
| BT1 | 1 | 1 | 1 |
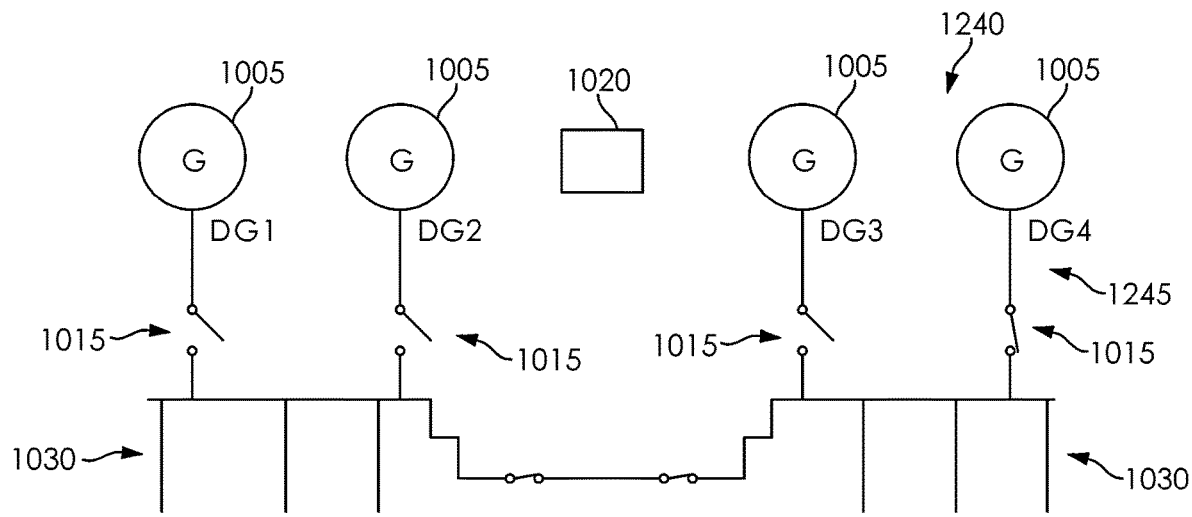
FIG. 7B
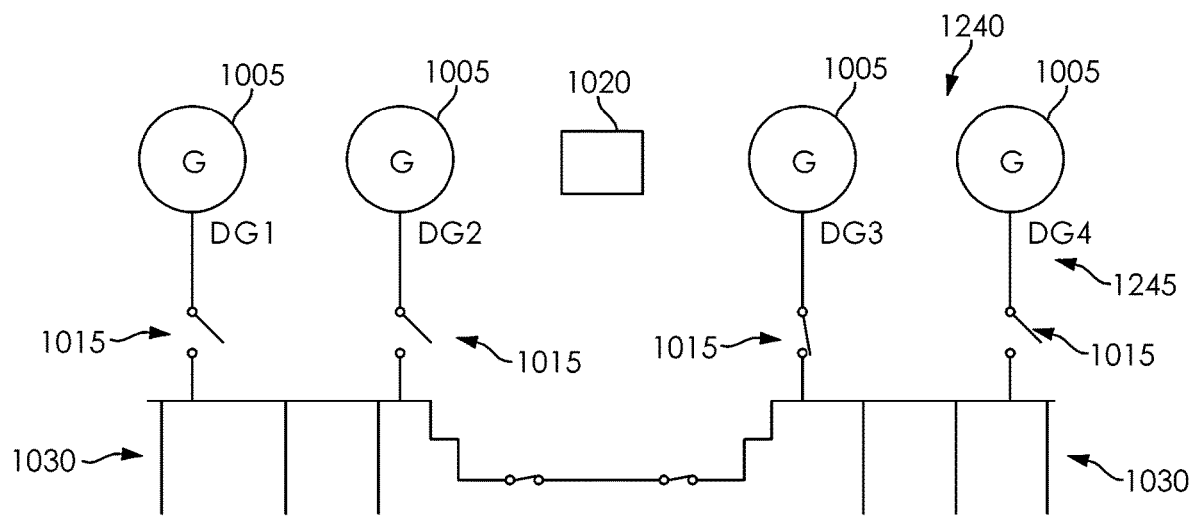
FIG. 7C

| | Before Test | Initiate Test | End Test |
|---|---|---|---|
| DG1 | 0 | 0 | 0 |
| DG2-A | 0 | 0 | 0 |
| DG2-B | 0 | 0 | 0 |
| DG3 | 1 | 1 | 1 |
| BT1-A | 0 | 0 | 1 |
| BT1-B | 1 | 1 | 1 |
| BT2-A | 1 | 0 | 0 |
| BT2-B | 1 | 1 | 1 |

SYSTEM, APPARATUS, AND METHOD FOR TESTING OF AN ELECTRICAL SYSTEM

CROSS-REFERENCE TO RELATED APPLICATIONS

This application claims priority to provisional application 63/274,726 filed Nov. 2, 2021, provisional application 63/414,301 filed Oct. 7, 2022, and 63/414,310 filed Oct. 7, 2022, the entire disclosure of each of which is incorporated herein by reference.

TECHNICAL FIELD

The present disclosure is directed to a system, apparatus, and method for testing, and more particularly, to a system, apparatus, and method for testing of an electrical system.

BACKGROUND OF THE DISCLOSURE

Dynamic positioning vessels such as maritime vessels and platforms typically operate in open bus configurations that reduce fault propagation paths between redundancy groups, which may reduce a risk of losing a position of the vessel. Modern strengthening of environmental and emissions standards has prompted vessel operators to move to closed bus configurations. While beneficial, closed bus configurations can lead to loss of dynamic positioning capability if a power system is unable to ride through certain faults.

A conventional industry solution that addresses this issue is the use of live short circuit tests to prove fault ride through capability during closed bus operations. However, live short circuit testing involves danger to personnel, difficulty, and potential damage to vessels being tested. Live short circuit testing may also be unsuitable for many vessels.

Accordingly, existing maritime regulations allow alternative methods to live short circuit testing to be considered and used. However, conventional methods do not offer a comprehensive testing solution to verify a correct isolation and ride through capability of a closed bus system to prevent loss of dynamic positioning capability.

The exemplary disclosed system and method of the present disclosure is directed to overcoming one or more of the shortcomings set forth above and/or other deficiencies in existing technology.

SUMMARY OF THE DISCLOSURE

In one exemplary aspect, the present disclosure is directed to a method for a fault ride through testing of an electrical system including one or more power sources, one or more power consumers, and a first protective-isolation device and a second protective-isolation device both disposed between the one or more power sources and the one or more power consumers. The method includes prior to the fault ride through testing, opening the second protective-isolation device, and closing the first protective-isolation device, and during the fault ride through testing, opening both the first and second protective-isolation devices to block current flow between the one or more power sources and the one or more power consumers. The method also includes during the fault ride through testing, decreasing a terminal voltage of the one or more power sources using a voltage regulator, and following the fault ride through testing, opening the first protective-isolation device, and closing the second protective-isolation device.

In another aspect, the present disclosure is directed to a method for testing of an electrical system including a plurality of power sources, one or more power consumers, and a plurality of protective-isolation devices disposed between the plurality of power sources and the one or more power consumers. The method includes performing a fault ride through testing of the electrical system by selectively opening and closing each of the plurality of protective-isolation devices while decreasing a terminal voltage of at least one of the plurality of power sources using a voltage regulator. The method also includes varying a governor position of one of the plurality of power sources when the plurality of power sources is operating, inducing an over-excitation event that engages an over-excitation limiter of one of the plurality of power sources and an under-excitation limiter in each of the remaining power sources of the plurality of power sources, and performing earth fault testing of the plurality of power sources. The method further includes injecting at least one of controlled currents or voltages into the plurality of protective-isolation devices, injecting a high current low voltage signal into a bus of the one or more power consumers, and operating the one or more power consumers to selectively load the electrical system.

BRIEF DESCRIPTION OF THE DRAWINGS

Accompanying this written specification is a collection of drawings of exemplary embodiments of the present disclosure. One of ordinary skill in the art would appreciate that these are merely exemplary embodiments, and additional and alternative embodiments may exist and still within the spirit of the disclosure as described herein.

FIG. 7A is a schematic illustration of at least some exemplary embodiments of the present disclosure;

FIG. 7B is a schematic circuit illustration of at least some exemplary embodiments of the present disclosure;

FIG. 7C is a schematic circuit illustration of at least some exemplary embodiments of the present disclosure;

DETAILED DESCRIPTION AND INDUSTRIAL APPLICABILITY

The exemplary disclosed system, apparatus, and method may be used for testing a ride through capability of vessels utilizing dynamic positioning (e.g., maritime vessels and/or movable structures). For example, the exemplary disclosed system, apparatus, and method may be used for testing a ride through capability associated with a three-phase symmetrical short circuit. The exemplary disclosed system, apparatus, and method may provide demonstrable evidence of a vessel's closed bus equivalent integrity.

The exemplary disclosed system, apparatus, and method may be used with vessels, platforms, or structures that utilize dynamic positioning to maintain a position by automatically controlling propulsion systems (e.g., thrusters and propellers). For example, the exemplary disclosed system, apparatus, and method may be used with maritime vessels (e.g., cable-laying vessels, research vessels, cruise ships), offshore drilling units, and/or any other suitable movable vessel or structure.

Figure 1:
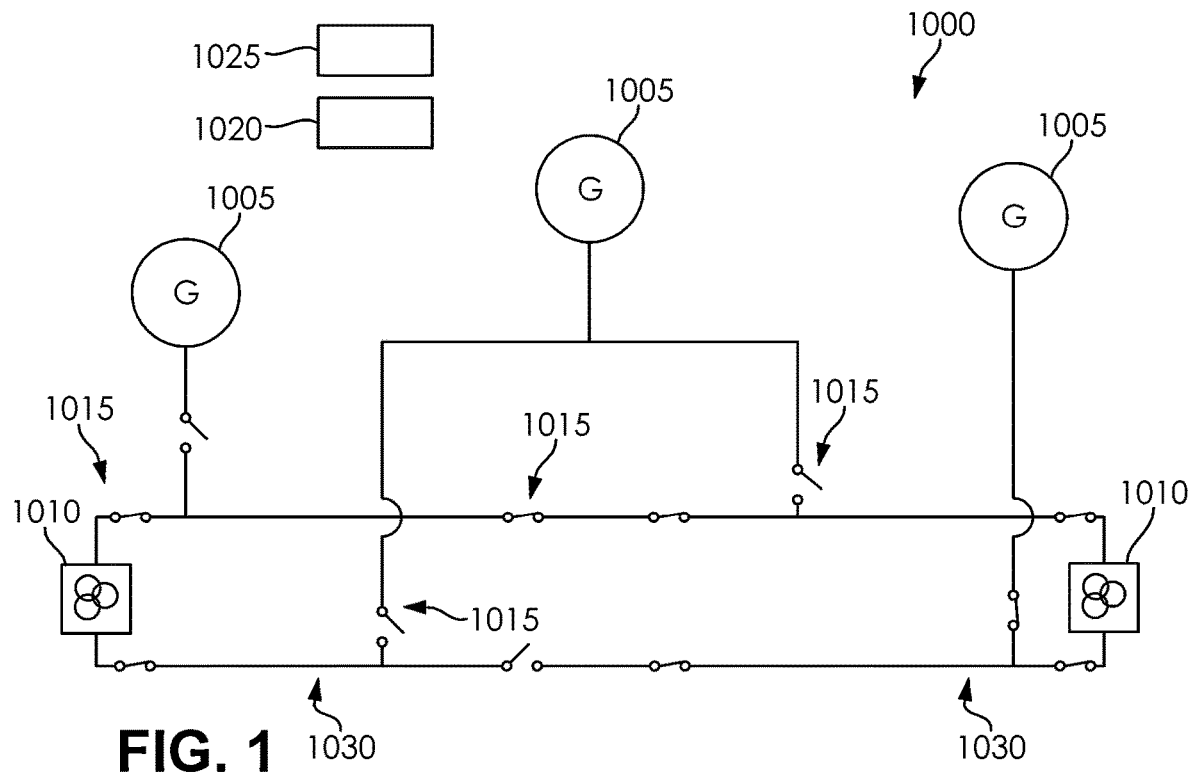
FIG. 1 is a schematic circuit illustration of at least some exemplary embodiments of the present disclosure.
Figure 2:
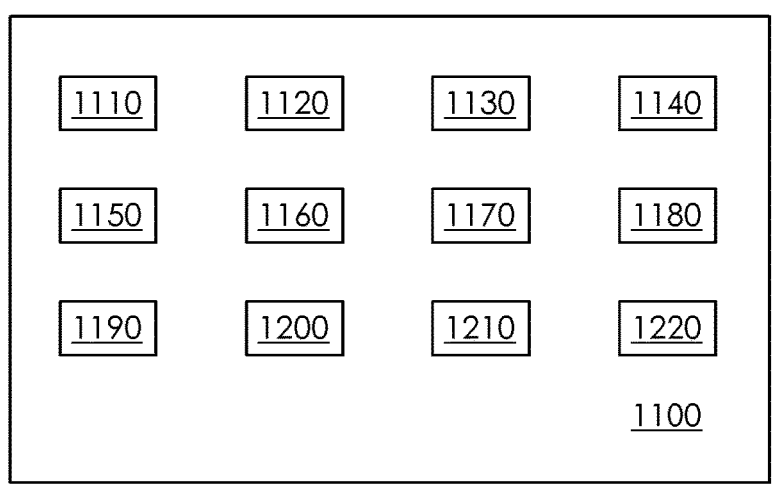
FIG. 2 is a schematic illustration of at least some exemplary embodiments of the present disclosure.

FIG. 1 illustrates an electrical system 1000 that may be tested using testing protocol 1100 illustrated in FIG. 2. Electrical system 1000 may include one or more power sources 1005 that may power one or more power consumers 1010. Power sources 1005 and power consumers 1010 may be selectively electrically connected and disconnected via operation of one or more protective-isolation devices 1015. A controller 1020 may control an operation of the one or more protective-isolation devices 1015. Electrical system 1000 may include a plurality of busses 1030 that may be electrical busbars or any other suitable electric power distribution component.

Power source 1005 may be any suitable power source or supply such as, for example, power supplies for use in offshore drilling applications, vessels using dynamic positioning, maritime operations, power generation and distribution applications, and/or any other suitable application involving electrical power. Power source 1005 may be a generator. Power source 1005 may be a low voltage DC power supply. Power source 1005 may provide power to one or more power consumers 1010 such as equipment, propellers, thrusters, machines, and/or any other suitable system, apparatus, or component utilizing electric power. For example, power consumers 1010 may provide for dynamic positioning of a vessel or maritime structure or platform.

Protective-isolation device 1015 may be a protective and/or isolation device. Protective-isolation device 1015 may be any suitable device for protecting and/or isolating an electrical system such as, for example, a diode, a circuit breaker, a DC/DC converter, an isolated DC supply, an electronic circuit protective device, an electro-mechanical circuit breaker or fuse, or any other suitable protective and/or isolation device.

One or more controllers 1020 may control an operation of electrical system 1000 and/or testing system components for example as described herein. Controller 1020 may include for example a micro-processing logic control device or board components. Also for example, controller 1020 may include input/output arrangements that allow it to be connected (e.g., via wireless and/or electrical connection) to other components of electrical system 1000 (e.g., protective-isolation devices 1015) and/or testing system components for example as described herein. Controller 1020 may communicate with other components of electrical system 1000 by any suitable communication technique (e.g., wire or wireless) for example as described herein. In at least some exemplary embodiments, controller 1020 may be a microcontroller (MCU) chip that may include and process some or substantially all storage and instructions for performing the exemplary disclosed operations. Controller 1020 may be a controller module that compares the measurement data (e.g., readings) from the exemplary disclosed components to determine if the exemplary disclosed testing results in a pass or a fail. Controller 1020 may operate based on instructions received from a user interface 1025. Controller 1020 may also operate based on algorithms or other predetermined criteria, machine learning for example as described herein, and/or any other suitable criteria. Controller 1020 may receive input from and provide output to user interface via direct communication (e.g., via user interface 1025 that may be attached, box-mounted, or remotely located), WiFi, Bluetooth, and/or any other suitable communication technique for example as described herein. Controller 1020 and any other suitable component (e.g., user interface 1025 and/or protective-isolation devices 1015) of electrical system 1000 may communicate with each other via any suitable communication method such as, for example, wireless communication (e.g., CDMA, GSM, 3G, 4G, and/or 5G), direct communication (e.g., wire communication), Bluetooth communication coverage, Near Field Communication (e.g., NFC contactless communication such as NFC contactless methods), radio frequency communication (e.g., RF communication such as short-wavelength radio waves, e.g., UHF waves), and/or any other desired communication technique. The exemplary disclosed components of electrical system 1000 may communicate similarly to for example as described herein regarding FIG. 13.

The exemplary disclosed system may include one or more modules that may be partially or substantially entirely integrated with one or more components of electrical system 1000 such as, for example, controller 1020. The one or more modules may be software modules as described for example below regarding FIG. 12. For example, the one or more modules may include computer-executable code stored in non-volatile memory. The one or more modules may also operate using a processor (e.g., controller 1020). The one or more modules may store data and/or be used to control some or all of the exemplary disclosed processes described herein.

User interface 1025 may be any suitable device for receiving input and/or providing output (e.g., raw data or other desired information) to a user of the exemplary disclosed system. User interface 1025 may be an external or internal human-machine interface device. User interface 1025 may be, for example, a touchscreen device (e.g., a smartphone, a tablet, a smartboard, and/or any suitable computer device), a computer keyboard and monitor (e.g., desktop or laptop), an audio-based device for entering input and/or receiving output via sound, a tactile-based device for entering input and receiving output based on touch or feel, a dedicated user device or interface designed to work specifically with other components of the exemplary disclosed system, and/or any other suitable user device or interface. For example, user interface 1025 may include a touchscreen device of a smartphone or handheld tablet. For example, user interface 1025 may include a display that may include a graphical user interface to facilitate entry of input by a user and/or receiving output. For example, the exemplary disclosed system may provide notifications to a user via output transmitted to user interface 1025 (e.g., and/or other components of electrical system 1000). User interface 1025 may also be any suitable accessory such as a smart watch, Bluetooth headphones, and/or other suitable devices that may communicate with components of the exemplary disclosed system. User interface 1025 may provide an interface for a user to select testing parameters, initiate tests, receive test results, provide feedback, and/or provide or receive any suitable input or output.

The exemplary disclosed system may include a data assembly that may be any suitable device for receiving, storing, and transferring data (e.g., a data storage). The exemplary disclosed data assembly may be similar to the exemplary disclosed storage medium described below regarding FIG. 12. The exemplary disclosed data assembly may make data available for external download for example via controller 1020, user interface 1025, and/or the exemplary disclosed module via any suitable communication technique for example as described herein.

FIG. 2 schematically illustrates testing protocol 1100. Testing protocol 1100 may be a protocol for testing (e.g., holistically testing) an electrical system such as electrical system 1000. Testing protocol 1100 may be an equivalent integrity protocol. Testing protocol 1100 may be a full testing package that when completed may provide substantial assurance (e.g., assurance) of a vessel's equivalent integrity for closed bus operations (e.g., of electrical system 1000 and/or other exemplary disclosed systems described herein). Testing protocol 1100 may include a protection setting audit 1110, fueling testing 1120, excitation testing 1130, over-voltage testing 1140, earth fault testing 1150, relay & protective device testing 1160, current sensing testing 1170, load application & rejection testing 1180, phase failure testing 1190, blackout recovery testing 1200, harmonic distortion testing 1210, and fault ride through testing 1220. Some or all of protection setting audit 1110, fueling testing 1120, excitation testing 1130, over-voltage testing 1140, earth fault testing 1150, relay & protective device testing 1160, current sensing testing 1170, load application & rejection testing 1180, phase failure testing 1190, blackout recovery testing 1200, harmonic distortion testing 1210, and/or fault ride through testing 1220 may be performed on electrical system 1000 (e.g., and/or other exemplary disclosed systems described herein that may be generally similar to electrical system 1000).

In at least some exemplary embodiments, protection setting audit 1110 may be performed prior to commencing testing and may include a review of system settings that may be completed and presented to a testing provider. Protection setting audit 1110 may be performed in advance of testing personnel and/or equipment mobilization to the testing site so that identified issues may be reviewed and corrected (e.g., with suitable revision control and management of change prior to commencing the testing program). Testing protocol 1100 may be performed without changing protection settings of a tested system. Alternatively, some or all (e.g., any) protection settings to be disabled or changed for a testing program may be noted. A final, comprehensive audit of protection settings may be performed after testing protocol 1100 is completed to provide for a return of all settings e.g., (if applicable) to the pre-test state prior to a tested vessel (e.g., electrical system 1000 and/or other exemplary disclosed systems described herein) returning to service.

In at least some exemplary embodiments, fueling testing 1120 may test for one or more exemplary disclosed power sources (e.g., generators) producing more or less power than is suitable for system operation. The exemplary disclosed conditions described below may result.

In a case in which a power source component (e.g., an engine) connected to a bus may experience an underfueling event, such an event may result in the affected machines producing less kW than other machines online, resulting in a load imbalance. The load imbalance may be followed by a reverse power fault if the fuel injected into an engine is reduced to a point that the engine no longer drives power source 1005 (e.g., a generator), causing the generator to consume power, and act as a motor.

In a case in which an engine connected to the bus may experience an overfuel event, the affected machine may produce more active power than is suitable. This event may cause the other machines online to produce less kW, resulting in a load imbalance. If such a fault is severe enough, other online generators may be pushed into reverse power. Overfuel events may result in an overfrequency if the injected fuel is increased to the point of affecting bus frequency. The mechanism for this may depend on the engine load sharing configuration (e.g., droop or isochronous).

An unstable fuel controller in a system may generate alarms due to kW imbalance and may cause a standby engine to start. If the fuel controller becomes unstable (e.g., too unstable such as unstable beyond a threshold), the generator may either enter reverse power, push healthy generators into reverse power, or trip the faulty unit's circuit breaker on overload or overcurrent. In addition to the exemplary disclosed faults, an unstable fuel controller may result in varying frequency, power, and voltage, making it difficult for a suitably operating (e.g., healthy) generator set to synchronize and connect to the bus.

A worst case failure associated with fueling failures may be the loss of one or more healthy generators and a subsequent loss of an unhealthy generator resulting in loss of power. From a detection perspective, a worst case may be where two generators are online and the healthy generators cannot "vote" the unhealthy generator off. Protection systems for fuel control faults that are based on (e.g., solely based on) voting on the operating points of generators may not reliably detect the faulty generator when there are two generators operating in parallel. If a system (e.g., electrical system 1000 and/or other exemplary disclosed systems described herein) is intended to perform dynamic positioning operations with two generators (including one generator and battery configurations), fueling tests may be performed in a two-generator configuration and/or base operating configurations.

Fueling testing 1120 (e.g., fuel system failure testing) may be performed as part of a DP FMEA program using a data-centric evidence-based approach to data collection. The rate at which a generator acquires load may be a criterion in the selection of protections and rapid and/or slow fueling faults may be included during validation during testing.

Fueling testing 1120 may be performed by varying a governor position of a single generator while the generator is online with other generators. If a system (e.g., electrical system 1000 and/or other exemplary disclosed systems described herein) is designed to run with two generators (e.g., or one generator and a battery), fueling testing 1120 may be performed with two generators online, with a fuel fault induced on one of the online generators. The adjustments to the governor may be made by use of any suitable mechanism that may not cause damage to the fuel delivery and/or the fuel control system. Acceptance criteria of fueling testing 1120 may include correct identification of a faulty unit and/or correct discrimination by isolating either the faulty engine or the bus to which the engine is connected. In at least some exemplary embodiments in which protections may be holistically verified, the generator may be isolated first (e.g., instead of the bus), which may allow for reduction of the disturbance (e.g., to reduce the possible failure effect).

In at least some exemplary embodiments, excitation testing 1130 may be performed to determine if reactive power output is not equal to reactive power requested. Excitation testing 1130 may be performed using any suitable excitation test device and/or the exemplary disclosed GVRT device for example described below. Various failure modes may cause this, including for example over-excitation events resulting in either a VAR imbalance or system over-voltage may occur, under-excitation events resulting in either a VAR imbalance or system under-voltage, and/or unstable excitation. Examples of faults (e.g., of electrical system 1000 and/or other exemplary disclosed systems described herein) may include loss of sensing, loss of field, faulty rotating diodes, and/or loss of automatic voltage regulator (AVR) control.

In a case in which a generator connected to a bus experiences an over-excitation event, the affected machine may produce more reactive power than is suitable for operation. This may cause other machines online to produce less kVAR, resulting in a reactive load imbalance, which may result in an uneven power factor distribution across some or substantially all (e.g., all) machines connected to the bus. If the fault is severe enough (e.g., severe beyond a predetermined threshold), other generators online may be pushed off-line on reverse reactive power. This may leave the affected machine alone on the bus, and increase bus voltage to the level of over-voltage trip, which may result in blackout. Also for example, the affected machine may experience overheating of the exciter field windings and/or generator rotor due to increased strength of the magnetic field.

In a case in which a generator connected to the bus experiences an under-excitation event, the affected machine may produce less reactive power than is suitable for operation. This may cause the other machines online to produce more kVAR, resulting in a reactive load imbalance, which may lead to uneven power factor distribution across some or substantially all (e.g., all) machines connected to the bus. If the fault is severe enough, the affected machine may trip on reverse reactive power, and the remaining machines on the bus may experience instantaneous increased terminal voltage that may cause critical equipment to trip on over-voltage. In addition, suitably operating machines (e.g., "healthy" machines) may experience overheating of the exciter field windings and generator rotor due to increased strength of the magnetic field.

An unstable AVR may result in VAR swings on the power system (e.g., of electrical system 1000 and/or other exemplary disclosed systems described herein). These swings, if large enough, may generate suitable alarms. If the controller becomes unstable (e.g., too unstable, for example unstable beyond a predetermined threshold), either the generator with the faulty AVR or healthy generators may be pushed outside of stability limits and/or heating limits. In this case, the generator may be removed from the system or the bus to which the generator is connected (e.g., and isolated). In addition to leading to a stability limit failure, an unstable AVR may make it difficult for a healthy generator set to synchronize and connect due to the large VAR swings on the bus.

A worst case failure associated with excitation failures may be the loss of a "healthy" generator (e.g., or generators) and/or subsequent loss of unhealthy generators resulting in blackout. From a detection perspective, the worst case may be where two generators are online and the healthy generators cannot "vote" the unhealthy generator off. Protection systems for excitation control faults that are based on voting on the operating points of generators may not reliably detect a faulty generator when there are two generators operating in parallel.

If a facility (e.g., electrical system 1000 and/or other exemplary disclosed systems described herein) is intended to perform dynamic positioning operations with two generators (e.g., or including one generator and battery configurations), excitation testing 1130 may be performed in two-generator configurations.

Excitation testing 1130 may be performed as part of the DP FMEA program. Excitation testing 1130 may be performed using a data-centric evidence-based approach to data collection. Excitation testing 1130 may include opening of the field connections to induce under excitation, opening of the voltage sensing lines to induce over excitation, removal of power from the AVR to simulate AVR failure, and/or manually adjusting the AVR settings to induce over or under excitation.

Excitation testing 1130 may be performed utilizing any suitable equipment to induce a slower and/or erratic excitation failure using a Generator Voltage Response Tester (GVRT) and/or a system of changing the feedback signal to the AVR. By altering the feedback to an AVR, excitation testing 1130 may induce an over-excitation event that may engage the over-excitation limiter (OEL) on the generator under test and under-excitation limiter (UEL) in healthy generators connected in parallel. Excitation testing 1130 may be performed to induce over and under excitation events on a single generator while load sharing with normally operating generators. Acceptance criteria of excitation testing 1130 may include correct identification of a faulty unit and/or correct discrimination by isolating either the faulty generator or the bus to which the generator is connected. In at least some exemplary embodiments in which protections may be holistically verified, the generator may be isolated first (e.g., instead of the bus), which may allow for reduction of the disturbance (e.g., to reduce the failure area).

In at least some exemplary embodiments, over-voltage testing 1140 may include performing testing related to over-voltage failure. Failures that can lead to an over-voltage failure may include over-excitation, earth faults, phase-to-phase faults, rapid load reduction, network resonance, switching events, physical contact with higher voltage system, and/or lightning strikes. Two worst case failures associated with over-voltage may include loss of some or all connected power sources due to tripping on over-voltage resulting in blackout, and/or thruster circuit breakers tripping due to over-voltage resulting in substantially total (e.g., total) loss of station-keeping capability. In these worst cases, primary protections may operate to prevent an extended over-voltage event from occurring. In the event that the primary protection fails, the bus-ties may be set to open on over-voltage protections (e.g., before any propulsion feeders or power supplies). If the facility (e.g., electrical system 1000 and/or other exemplary disclosed systems described herein) is intended to perform dynamic positioning operations with two generators (e.g., or including one generator and battery configurations), over-voltage tests may be performed in a two-generator configuration and/or any other suitable operational configurations.

In at least some exemplary embodiments, over-voltage testing 1140 may include performing testing as part of a DP FMEA program. Over-voltage testing 1140 may include performing testing using any suitable excitation test device. Over-voltage testing 1140 may include performing testing using a data-centric evidence-based approach to data collection. Over-voltage testing 1140 may include manually adjusting the AVR set points or injection testing by an OEM. Over-voltage testing 1140 may be conducted by gradually increasing the bus voltage using any suitable over-excitation test device. For example, the over-excitation device may induce a controlled over-voltage on the system without changing any system settings or parameters.

In at least some exemplary embodiments, earth fault testing 1150 (e.g., ground fault testing) may include testing the ground of the system (e.g., electrical system 1000 and/or other exemplary disclosed systems described herein). The earth or ground may include a vessel hull and some or substantially all (e.g., all) equipment that is directly bonded to it. Earthing (e.g., grounding) may be completed in such a way that a fault does not introduce step touch potential (e.g., that may put life and equipment at risk). Earth fault testing 1150 may involve testing for a ground fault that occurs when a live conductor connects to the ground of the system.

In at least some exemplary embodiments, the exemplary disclosed system (e.g., electrical system 1000 and/or other exemplary disclosed systems described herein) may be fitted with an Isolated Terra (IT) system. In an IT system, the generator neutral may not be directly connected to a vessel's hull. Configurations may be used such as, for example, a fully isolated and floating system, a neutral grounding resistor (NGR), or an open or broken delta earth fault detection system. An isolated and floating system may include the use of insulation monitoring systems (e.g., or similar systems) to identify potential earth faults. These systems may be complex and may involve automation to change detection based on network configuration. NGR systems may be used to limit the fault currents experienced when a single phase goes to ground. This may be achieved by connecting the generator neutral points to a vessel's hull through an impedance that has been sized to allow detection and isolation of the fault (e.g., while reducing or limiting the incident energy at the fault point). Open or broken delta systems may be implemented by using any suitable transformer that measures the voltage vectors of the system. These systems may not allow significant currents to flow while allowing for accurate detection of earth faults and isolation of the fault from the network. This type of protection may involve correctly sized equipment and determination of capacitive currents of the network to reduce or substantially prevent false tripping.

Figure 3:
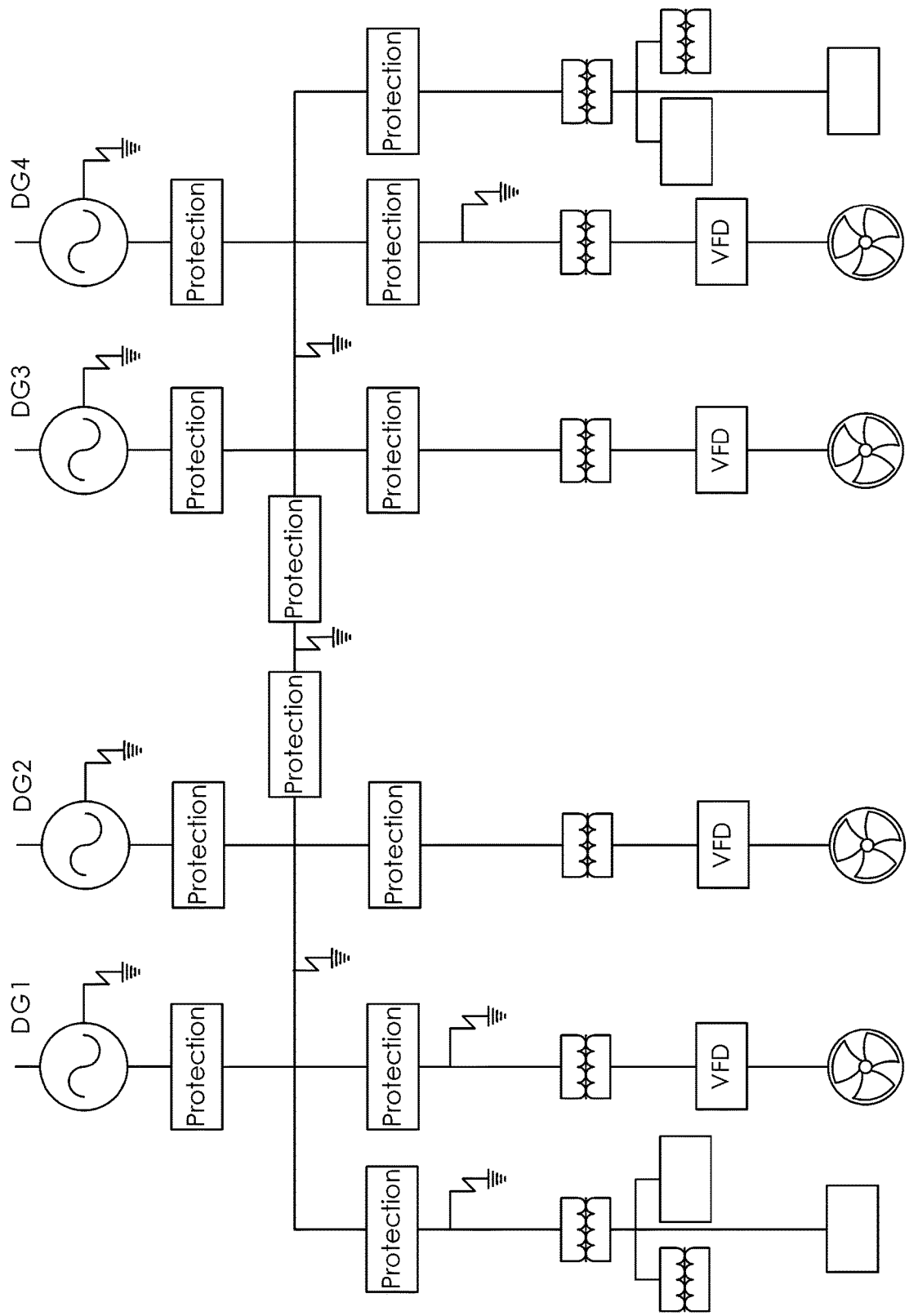
FIG. 3 is a schematic circuit illustration of at least some exemplary embodiments of the present disclosure.

In at least some exemplary embodiments, earth fault testing 1150 may be performed by connecting a phase (e.g., a single phase) to ground. This may be done at multiple points on the network and/or in suitable operating configurations including open and closed bus configurations. FIG. 3 illustrates an exemplary configuration (e.g., including power sources DG1, DG2, DG3, and DG4 that may be similar to power source 1005). As illustrated in FIG. 3, an area of coverage of earth fault testing 1150 may include each bus, each generator, areas between the buses, and some or substantially all feeders. Earth fault testing 1150 may be performed to validate earth fault detection, earth fault discrimination, earth fault zones, CT direction, and/or calculated values of earth fault analysis. Earth fault testing 1150 may be performed as part of a DP FMEA program. Earth fault testing 1150 may be performed using a data-centric evidence-based approach to data collection was used. Acceptance criteria of earth fault testing 1150 may include correct alarms of earth faults and/or correct discrimination and isolation of earth faults.

In at least some exemplary embodiments, relay & protective device testing 1160 may include secondary injection testing that may be used to confirm a correct operation of electronic and/or electromechanical protection devices and relays. Relay & protective device testing 1160 may be performed by injecting voltage and currents at desired (e.g., correct) phase angles into protection device sensing terminals by use of any suitable secondary injection testing tool. The secondary injection testing tool may generate voltages and currents that may be similar to or the same as those that may be generated by the network CTs and PTs in a fault scenario. The secondary injection testing tool may thereby confirm the settings and tripping times of the protection device and associated circuit breakers (e.g., protective-isolation devices 1015). Some or substantially all protective devices may be configured to trip different or multiple circuit breakers (e.g., protective-isolation devices 1015) based on fault type, severity, and/or location. Relay & protective device testing 1160 may include secondary injection testing that may be used on electronic and/or electromechanical protection devices to validate some or all protection functions, some or all protection settings, correct circuit breaker opening, circuit breaker opening times, and/or network coordination.

Figure 4:
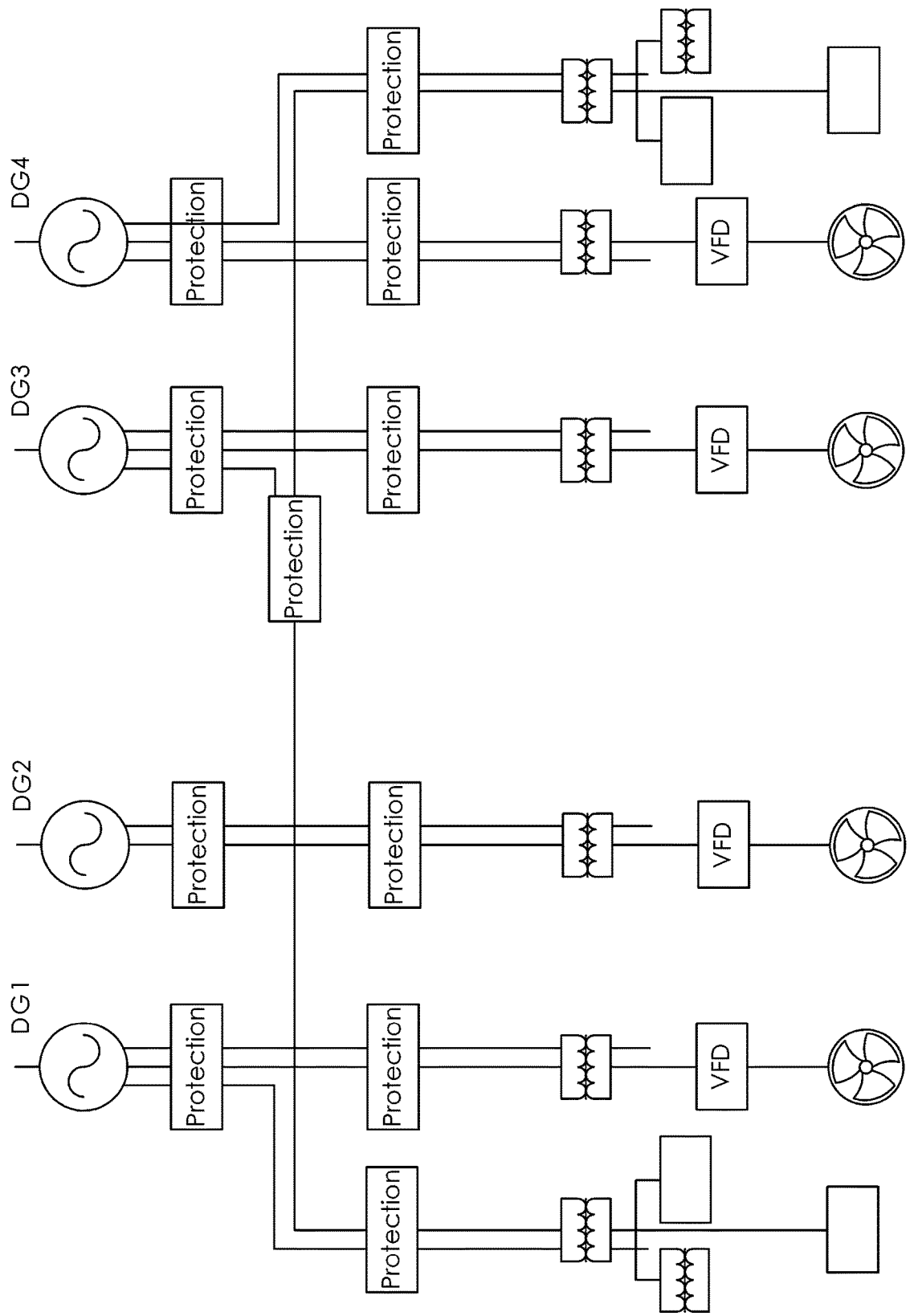
FIG. 4 is a schematic circuit illustration of at least some exemplary embodiments of the present disclosure.

A worst case for selectivity may be a protection that fails to act suitably and may cause the bus and associated network to be unable to correctly isolate the fault, leading to a loss greater than WCFDI. Relay & protective device testing 1160 may accordingly be performed to confirm that substantially all (e.g., all) protections operate at a correct threshold and time. Relay & protective device testing 1160 may inject controlled current and voltages into protective devices using any suitable testing equipment. FIG. 4 illustrates an exemplary area of coverage (e.g., including power sources DG1, DG2, DG3, and DG4 that may be similar to power source 1005) for secondary injection testing of relay & protective device testing 1160.

In at least some exemplary embodiments, current sensing testing 1170 may include validation of the current sensing equipment and interconnections to provide a safe operation of a closed bus vessel (e.g., electrical system 1000 and/or other exemplary disclosed systems described herein). Current sensing testing 1170 may include primary injection testing, which may include injecting current directly into the bus and distribution cables of the network (e.g., electrical system 1000 and/or other exemplary disclosed systems described herein). For example, any suitable primary injection testing tool may inject a high current low voltage signal onto the bus or cables that pass through the network CTs and/or Rogowski coils (Rcoil) and measures the resultant output at the protection device. The primary injection testing of current sensing testing 1170 may confirm that the correct measurement devices have been installed in the correct direction and that substantially no transposition of interconnected wiring has occurred. The primary injection testing of current sensing testing 1170 may also confirm correct selection and settings of Rogowski coil integrators. The primary injection testing of current sensing testing 1170 may validate CT and Rcoil ratios, CT and Rcoil tolerance, CT and Rcoil direction, CT and Rcoil connections, interconnected wiring, and/or OEM trip curves within tolerance.

Figure 5:
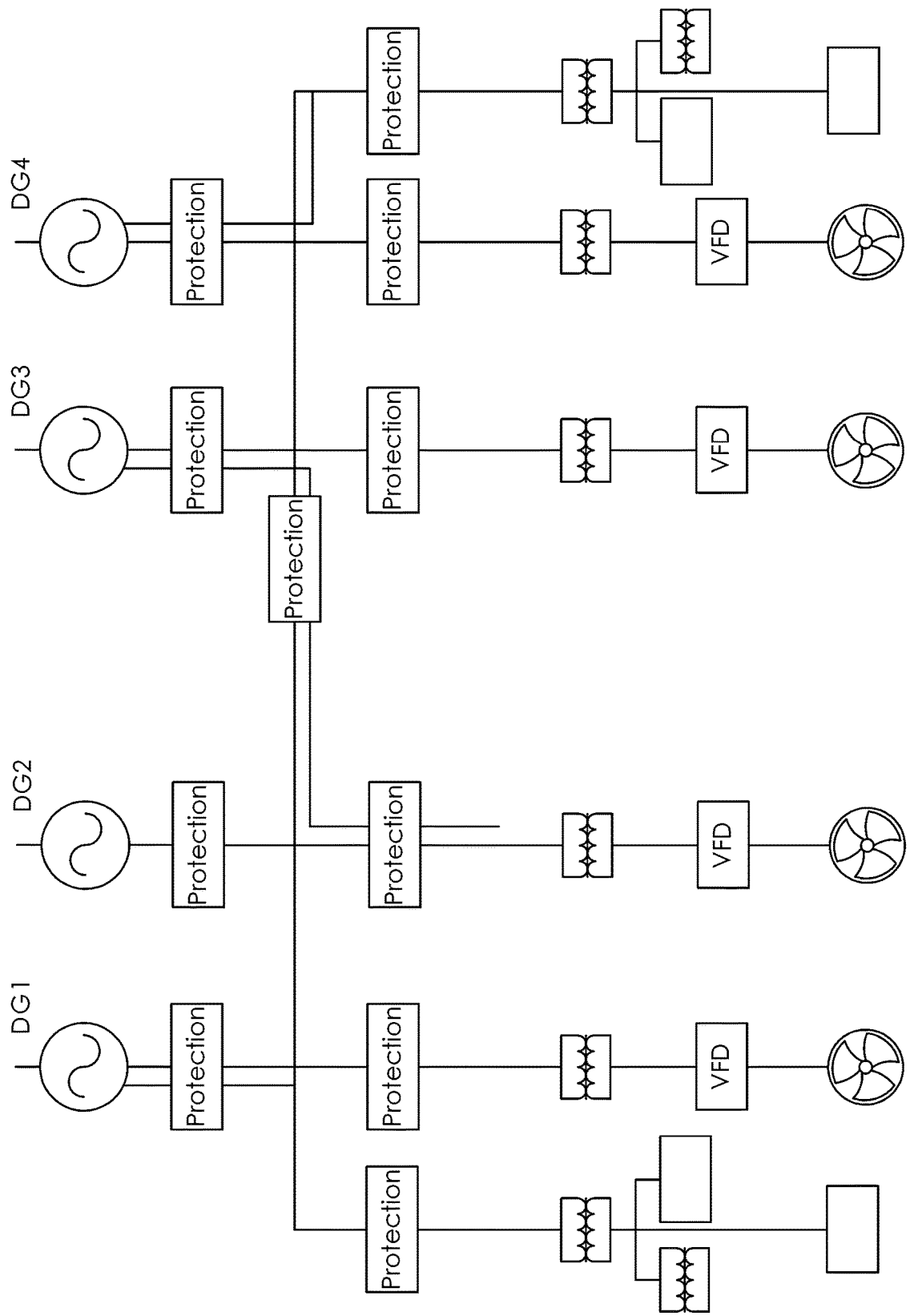
FIG. 5 is a schematic circuit illustration of at least some exemplary embodiments of the present disclosure.

A worst case failure for current sensing may be a situation in which a CT detects a fault incorrectly and communicates this fault to the system, resulting in a spurious loss of a healthy section and causing the fault to not be cleared as set forth by designed criteria. This may result in a system disturbance exceeding WCFDI. Accordingly, current sensing testing 1170 may be used to check some or all CTs and R-Coils on the main bus, feeders from the main buses, and generators for function and direction. In at least some exemplary embodiments, current sensing testing 1170 may be performed using a CPC-100 unit (e.g., or similar device), with a CPOL2 Polarity checker from Omicron (e.g., or similar device) for onsite primary injection testing. Additional auxiliary equipment may also be utilized based on a configuration of the facility being tested (e.g., electrical system 1000 and/or other exemplary disclosed systems described herein). Current sensing testing 1170 should be performed to check some or substantially all (e.g., all) CTs and R-Coils on the main bus, feeders from the main buses, and generators for function and direction. FIG. 5 illustrates an exemplary area of coverage (e.g., including power sources DG1, DG2, DG3, and DG4 that may be similar to power source 1005) for primary injection testing of current sensing testing 1170.

In at least some exemplary embodiments, load application & rejection testing 1180 may address outcomes of significant load steps on a distribution network (e.g., electrical system 1000 and/or other exemplary disclosed systems described herein) for closed bus operations (e.g., to ensure system responses are within Class requirements for a system disturbance, including for example the amplitude of the excursion and time it takes to stabilize after a disturbance). For example in cases where the AVR and/or speed controllers are not correctly tuned, load application and rejection can lead to significant voltage and frequency deviations. The deviations, if extreme, may destabilize a network and lead to instances of blackout. Load application & rejection testing 1180 may also be used to verify power management system responses such as load shedding and phaseback of drives. Load application & rejection testing 1180 may be performed to validate system stability during large load swings, settling time after a significant load change, and/or power management functions such as load shedding and phaseback.

In a worst case failure on load application, the system (e.g., electrical system 1000 and/or other exemplary disclosed systems described herein) may not respond quickly enough, leading to multiple generators tripping on under-frequency, under-voltage, and/or similar protections, resulting in failure exceeding WCFDI. On load rejection, if the system does not react with a critically damped response, the system may induce over-speed or over-voltage on multiple generators, causing failure exceeding WCFDI. Load application & rejection testing 1180 may be performed in a manner that is representative of the configurations that a vessel or platform (e.g., electrical system 1000 and/or other exemplary disclosed systems described herein) may be operating in. For example, if the system is designed to operate with a single generator on one bus with energy storage on the second bus and bus-ties closed, load application & rejection testing 1180 may include removal of the online generator while at or close to 100% load. Load application & rejection testing 1180 may thereby demonstrate that the power management system and energy storage systems have been correctly configured and do not result in a blackout.

In at least some exemplary embodiments, load application & rejection testing 1180 may include using load banks (e.g., similar to power consumers 1010) connected to a main bus. Load banks may allow for precision control of the load, both active and reactive, that is being applied to or removed from the distribution network. For load application, load application & rejection testing 1180 may use thrusters and large consumers such as draw works and/or firefighting pumps. For load rejection, load application & rejection testing 1180 may include loading the system (e.g., electrical system 1000 and/or other exemplary disclosed systems described herein) with thrusters and/or other auxiliary loads and/or using shutdowns or opening circuit breakers to unload. Load application & rejection testing 1180 may utilize load steps of at least 80% during equivalent integrity validation to confirm that blackout does not occur.

In at least some exemplary embodiments, load application & rejection testing 1180 may include implementing phaseback and load shedding to ensure that sudden disturbances of either increased active power demand, or reduction in available active power, do not result in generators tripping offline. For example, a sudden increase in demand from a generating unit may result in a reduction of bus frequency, or increase of current above the overload limits of the circuit breakers. Instances of events involving phaseback and/or load shedding may include mechanical or electrical failure of an online generator, squalls or wind gusts, sudden demands in load due to failure of controllers, electrical faults on the network, and/or starting of large consumers (e.g., power consumers 1010). Also for example, phaseback and load shedding may be triggered by frequency events, bus power events, generator power events, protective systems that trigger load reduction on events in the network, and/or other protections. For example when an event occurs, load may be removed and/or rapidly reduced from the network (e.g., of electrical system 1000 and/or other exemplary disclosed systems described herein) to avoid overload and blackout.

In at least some exemplary embodiments, a power management system (e.g., electrical system 1000 and/or other exemplary disclosed systems described herein) that fails to control load may experience a sustained overload of the system. This sustained overload may lead to multiple generators tripping on overload (e.g., simultaneously or in a cascade), which may lead to loss beyond WCFDI. Phaseback and load shedding testing may be performed similarly to current sensing testing 1170.

In at least some exemplary embodiments, phase failure testing 1190 may include phase imbalance testing and/or shorting a CT. Causes of phase imbalance may include incorrectly balanced single phase loads, motor winding failure, loss of a phase, phase to phase fault, and/or phase to ground fault. Phase imbalance may result in negative and zero sequence currents in the system (e.g., electrical system 1000 and/or other exemplary disclosed systems described herein) that may cause heating in generators, transformers and motors. Phase failure testing 1190 may detect the introduction of imbalance using protective devices using core CTs and PTs. Phase failure testing 1190 may include performing phase imbalance testing to validate correct detection of failures and/or correct discrimination.

In at least some exemplary embodiments, incorrect coordination resulting in operation of generator protections for a downstream phase failure may lead to loss greater than WCFDI. In cases where protection relays may be set for phase imbalance protection, phase failure testing 1190 may use secondary injection testing (e.g., or any other suitable technique) to verify a correct setting of criteria (e.g., limits) and timing on phase imbalance. Other suitable techniques may include open circuiting a single phase of a main feeder such as a bus feeder (e.g., or transformer feeder of other suitable feeder), short circuiting a CT secondary, open circuiting a single phase of a PT secondary, and/or a phase to earth fault.

In at least some exemplary embodiments, blackout recovery testing 1200 may include testing for section blackout recovery (e.g., based on maintaining dynamic positioning to remain on station when losing a section of a vessel based on its WCFDI). Blackout recovery testing 1200 may also include substantially complete (e.g., complete) blackout recovery. In at least some exemplary embodiments, blackout recovery testing 1200 may not involve cold starts.

In at least some exemplary embodiments, harmonic distortion testing 1210 may address harmonic distortion caused by consumers (e.g., power consumers 1010) having high speed switching mechanisms such as variable frequency drives, silicon controlled rectifiers (SCRs), switch mode power supplies, and other power electronic devices. In at least some exemplary embodiments, total harmonic distortion (THD) may not exceed 8%, and any single harmonic may not exceed 5% for suitable operation (e.g., THD on the main bus). A harmonic distortion study may be completed as part of the initial design of a vessel (e.g., electrical system 1000 and/or other exemplary disclosed systems described herein). This study may be done to evaluate the system running in the operational bus configurations with a variety of expected loads. Harmonic distortion testing 1210 may verify parameters of the study via use of a THD meter (e.g., a THD meter integrated into an electronic power meter). In at least some exemplary embodiments for systems including harmonic cancelling devices, a model of a network response to a harmonic canceling device failure may be used with harmonic distortion testing 1210. For example, this model may then be verified by measuring the THD in operational configurations (e.g., via the THD meter) with a variety of loads both with and without the harmonic cancelling device functioning.

In at least some exemplary embodiments, fault ride through testing 1220 may test a capability of a network (e.g., of electrical system 1000 and/or other exemplary disclosed systems described herein) to ride through significant voltage transients associated with short circuit faults. Voltage waveforms associated with a short circuit may include a sudden drop in voltage followed by a recovery that may overshoot the system nominal voltage. Failure mechanisms associated with the transient voltage may include loss of auxiliary systems, loss of drives or thrusters, loss of controllers, and/or loss of buses. The under-voltage section of the transient waveform may result in loss of power to controllers or auxiliary equipment due to control relays and motor contactors opening. Loss of power to buses may be experienced with under-voltage trips not being equipped with suitable delays to prevent premature opening. Failures that may be experienced with the transient over-voltage section of the waveform may include main drives tripping on DC link over-voltage and damage to equipment if the transient over-voltage section is too extreme (e.g., beyond a predetermined threshold for over-voltage).

In at least some exemplary embodiments, fault ride through testing 1220 may be performed to verify that some or all unfaulted buses that power DP systems stay online, drive ride through settings are correct, DP critical auxiliary equipment such as cooling and oil pumps stay online, and/or AVRs are correctly tuned. A worst case failure for fault ride through testing may be a three-phase short circuit on the main bus. In testing for this worst case failure, fault ride through testing 1220 may address transients on some or all drives and consumers (e.g., power consumers 1010) as may be encountered in a live short circuit.

Fault ride through testing 1220 may include GVRT testing 1230 and ZVRT testing 1240. GVRT testing 1230 may include the exemplary disclosed Generator Voltage Response Tester (GVRT™), which may achieve an under-voltage event followed by a transient over-voltage without risk of damage (e.g., as may be caused by a live short circuit) to a network (e.g., of electrical system 1000 and/or other exemplary disclosed systems described herein). ZVRT testing 1240 may include the exemplary disclosed ZeroDip™ test configuration that may introduce a relatively sharp and pronounced low voltage transient. When GVRT testing 1230 and ZVRT testing 1240 are used together in fault ride through testing 1220, a voltage waveform representative of a short circuit may be achieved. The use of GVRT testing 1230 and ZVRT testing 1240 of fault ride through testing 1220 may provide a controlled technique for inducing a voltage drop followed by an over-voltage transient that may be a response generated by the exemplary disclosed system (e.g., of electrical system 1000 and/or other exemplary disclosed systems described herein) and may not involve changes (e.g., any changes) to the system settings. As further described below, fault ride through testing 1220 (e.g., including GVRT testing 1230 and ZVRT testing 1240) may be conducted for a period of time that may be equal to or greater than a tripping time of bus-ties of the exemplary disclosed system. Exemplary embodiments of GVRT testing 1230 and ZVRT testing 1240 are described below.

Figure 6A:
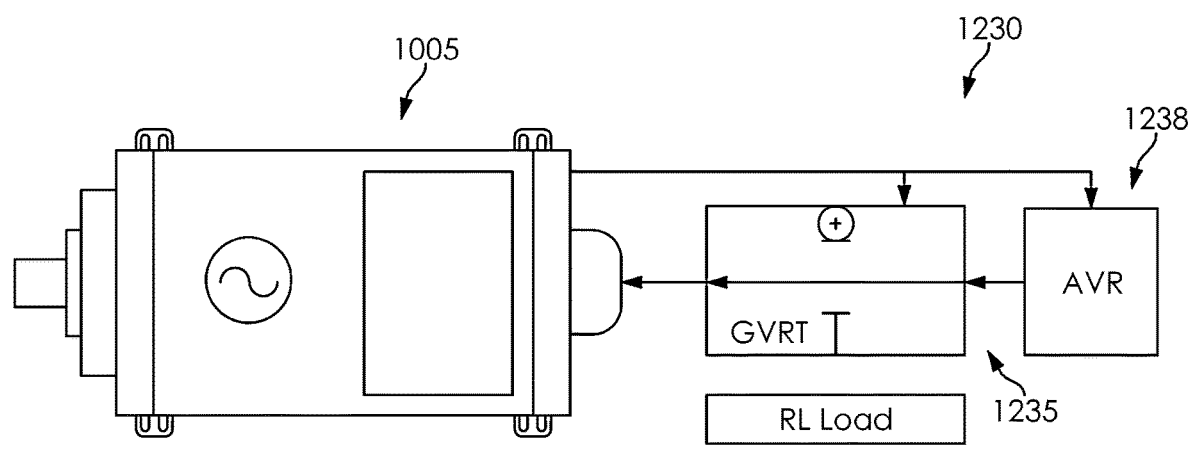
FIG. 6A is a schematic illustration of at least some exemplary embodiments of the present disclosure.
Figure 6B:
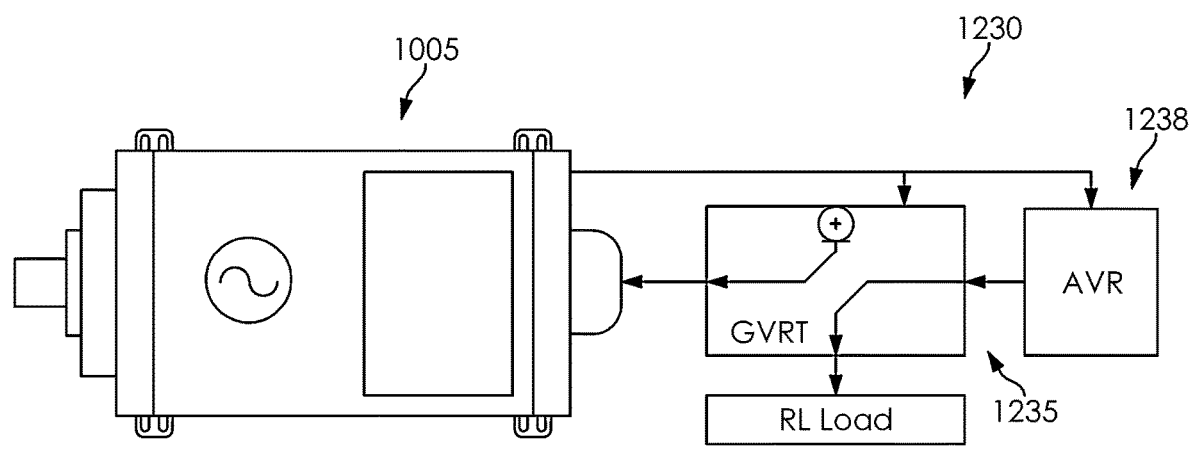
FIG. 6B is a schematic illustration of at least some exemplary embodiments of the present disclosure.

FIGS. 6A and 6B illustrate an exemplary embodiment of GVRT testing 1230. GVRT testing 1230 may include using a GVRT device 1235. GVRT device 1235 may be a generator voltage response tester or any other suitable device for testing a power source voltage. GVRT device 1235 may be electrically connected between power source 1005 and a voltage regulator 1238. Voltage regulator 1238 may be an automatic voltage regulator or any other suitable device for stabilizing power supply voltage to a load such as an RL load as illustrated in FIGS. 6A and 6B. GVRT device 1235 may be electrically connected to power source 1005 and voltage regulator 1238 to produce an under-voltage event followed by a transient over-voltage without substantial risk of damage (e.g., as may be cause by a live short circuit) to a network (e.g., of electrical system 1000 and/or other exemplary disclosed systems described herein). FIG. 6A illustrates uninterrupted control by voltage regulator 1238, pre-test and post-test, of GVRT testing 1230. FIG. 6B illustrates an arrangement of voltage regulator 1238 to RL Load during a test of GVRT testing 1230.

GVRT device 1235 may interrupt the excitation current from voltage regulator 1238 (e.g., to a field winding) causing a reduction in the magnetic field of power source 1005 (e.g., of the rotor of the generator and the internally generated voltage $E_A$). $E_A$ may be the internal voltage of power source 1005 (e.g., generator voltage) and not for example the terminal voltage $V_t$ of the exemplary disclosed machine. For example in a system with multiple generators connected (e.g., electrical system 1000 and/or other exemplary disclosed systems described herein), a drop in $E_A$ of a single generator may result in a reduction of VARs produced by the machine, while the terminals of power source 1005 (e.g., generator terminals) may remain at the network voltage. In the case of a single power source 1005 connected to the network, a drop in $E_A$ may result in a drop of the terminal voltage and the network voltage. A reduction of excitation on all exemplary disclosed machines may simultaneously result in reduction in network voltage.

In at least some exemplary embodiments, a GVRT ride through testing sequence of GVRT testing 1235 may include the following steps. Selected voltage regulators 1238 are switched from the generator field winding to an internal resistive inductive (RL) load as illustrated in FIG. 6B. The generator terminal voltage starts to decrease. The output current of voltage regulator 1238 increases in an attempt to maintain the correct terminal voltage. The output of voltage regulator 1238 stays switched to the RL load and continues to increase while the terminal voltage continues to decrease for the test duration. When the test time elapses, voltage regulator 1238, still producing a large excitation current, switches to back to the field. The high excitation current is applied to the generator field winding causing the terminal voltage to start to recover and subsequently overshoot the network's nominal voltage (e.g., of electrical system 1000 and/or other exemplary disclosed systems described herein).

In at least some exemplary embodiments, when voltage regulator 1238 is switched to the RL load, a reduction in terminal voltage may occur that results in an increase in the current output of voltage regulator 1238. The exemplary sequence of GVRT testing 1230 may achieve an under-voltage event followed by a transient over-voltage without risk of damage (e.g., as in a live short circuit).

In at least some exemplary embodiments, a GVRT waveform of GVRT testing 1230 may provide a suitable match to short circuit behavior for a transient over-voltage after a fault has been cleared. GVRT testing 1230 and ZVRT testing 1240 together may provide a controllable, low voltage event similar to that experienced during a period before a short is cleared from the system (e.g., electrical system 1000 and/or other exemplary disclosed systems described herein). As further described below, ZVRT testing 1240 may include using a controlled high speed circuit breaker switching logic to induce an event isolating some or substantially all (e.g., all) incoming supplies to the section (e.g., bus section) of the network under test. ZVRT testing 1240 may then re-apply a supply once a test time has elapsed. ZVRT testing 1240 may also include features (e.g., built-in interlock features) that may prevent synchronization crash. ZVRT testing 1240 may induce a low voltage ride through test on each system bus-bar individually, all busses if a single power source 1005 (e.g., generator) may be sufficient to power the vessel systems, or multiple bus sections depending on a network bus configuration.

In at least some exemplary embodiments, ZVRT testing 1240 may include any suitable zero-volts ride through testing. ZVRT testing 1240 may include ZVRT testing such as breaker testing. For example, ZVRT testing 1240 may include dual breaker ZVRT testing. ZVRT testing 1240 may include using a switching device 1245 that may be a high-speed breaker switching device or any other suitable device for providing zero-volts ride through testing. Switching device 1245 may be a dual breaker device. Switching device 1245 may be a high-speed dual breaker switching device. As illustrated in FIGS. 7B and 7C, switching device 1245 may include a plurality of protective-isolation devices 1015 that may selectively electrically connect a plurality of power sources 1005 (e.g., DG1, DG2, DG3, and/or DG4) to busses 1030. Switching device 1245 may include two protective-isolation devices 1015 for example at DG3 and DG4 that may selectively open and close based on the electronic signals of switching device 1245 (e.g., as controlled by controller 1020). Based on control of protective-isolation devices 1015 for example at DG3 and DG4, zero-volts may be induced on a bus (e.g., one or more busses 1030) for a controlled duration. FIG. 7A illustrates an exemplary truth table of protective-isolation devices 1015. FIG. 7B illustrates a pre-test arrangement of switching device 1245. FIG. 7C illustrates a post-test arrangement of switching device 1245.

ZVRT testing 1240 utilizing switching device 1245 may include inbuilt dead-bus interlocks that may substantially prevent closing the live portion of the system onto another live system, inbuilt data-capture that may be synchronizable to a vessel (e.g., electrical system 1000 and/or other exemplary disclosed systems described herein) and that may include markers for test start and test stop so that breaker reaction times may be confirmed. ZVRT testing 1240 may have controllable test durations allowing repeatable results for trouble shooting and year-on-year (e.g., year-over-year) comparisons. ZVRT testing 1240 may be performed independently of a system's protections so that no setting changes may be involved to perform the test. ZVRT testing 1240 may identify thruster drive failures (e.g., under voltage trip), thruster drive failures (e.g., unable to ride through at operational speed due to kinetic ride through arrangement), industrial mission drive failures (e.g., under voltage trip), loss of distribution switchboards (e.g., under voltage trip), loss of cooling fans and/or auxiliaries (e.g., drop out due to loss of control relays and/or contactors), loss of main switchboards (e.g., drop out due to loss of control), loss of main switchboards (e.g., under voltage trip), and/or loss of thruster control cabinets (e.g., shutdown due to voltage dip). Switching device 1245 may be connected and/or installed with the exemplary disclosed system as any of a temporary installation, a permanent installation, or an integrated installation.

Figures 8A, 8B:
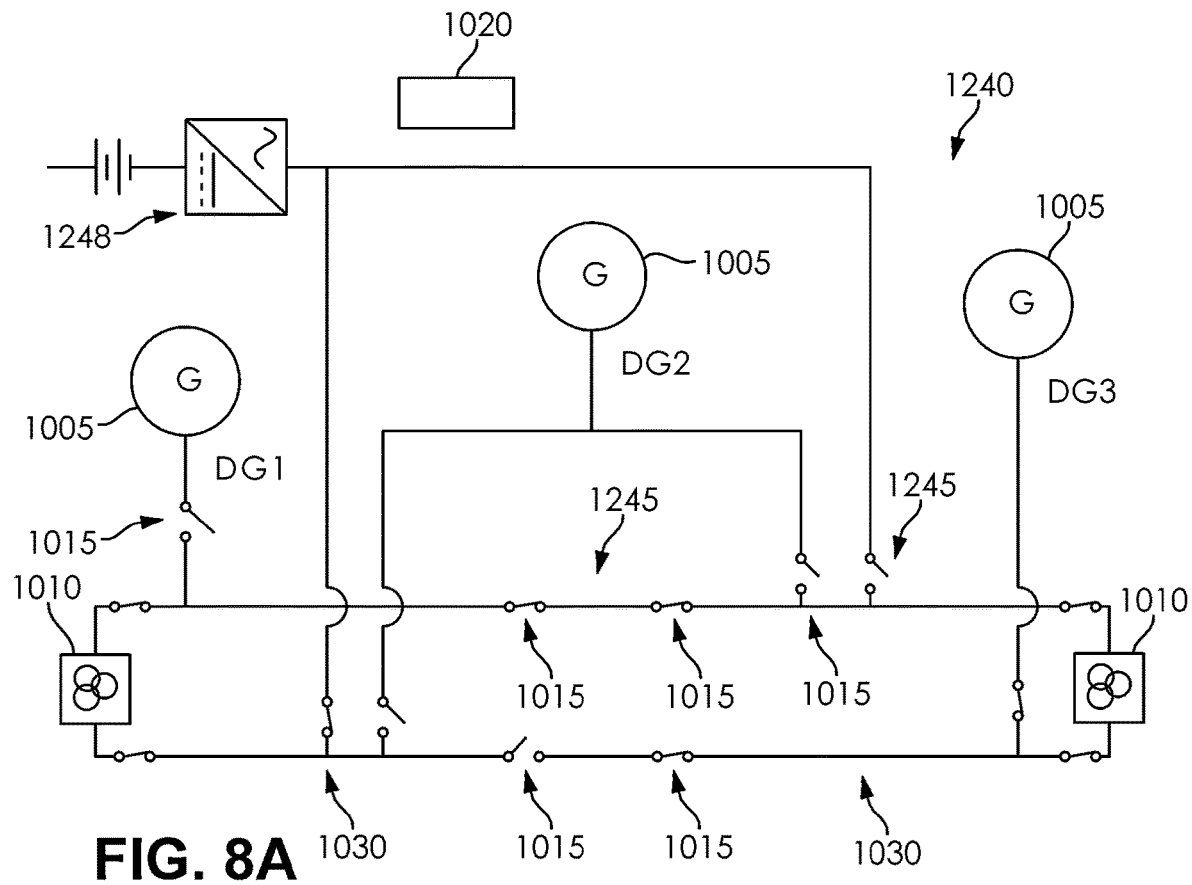
FIG. 8A is a schematic circuit illustration of at least some exemplary embodiments of the present disclosure.
FIG. 8B is a schematic illustration of at least some exemplary embodiments of the present disclosure.

FIG. 8A illustrates another exemplary embodiment of ZVRT testing 1240 utilizing switching device 1245. FIG. 8B illustrates an exemplary truth table of protective-isolation devices 1015. In at least some exemplary embodiments, switching device 1245 may include a temporary (e.g., external) testing installation utilizing testing device 1248 that may be any suitable testing device for testing zero-volts ride through. ZVRT testing 1240 may be run via an algorithm (e.g., similar to the exemplary disclosed sequences described herein) using testing device 1248. The sequence of ZVRT testing 1240 of FIGS. 8A and 8B may be generally similar as described above regarding FIGS. 7A-7C. Acceptance criteria of ZVRT testing 1240 may be for example ride through of substantially all dynamic positioning equipment after voltage dip below 60% of nominal for 500 ms.

Figure 9A:
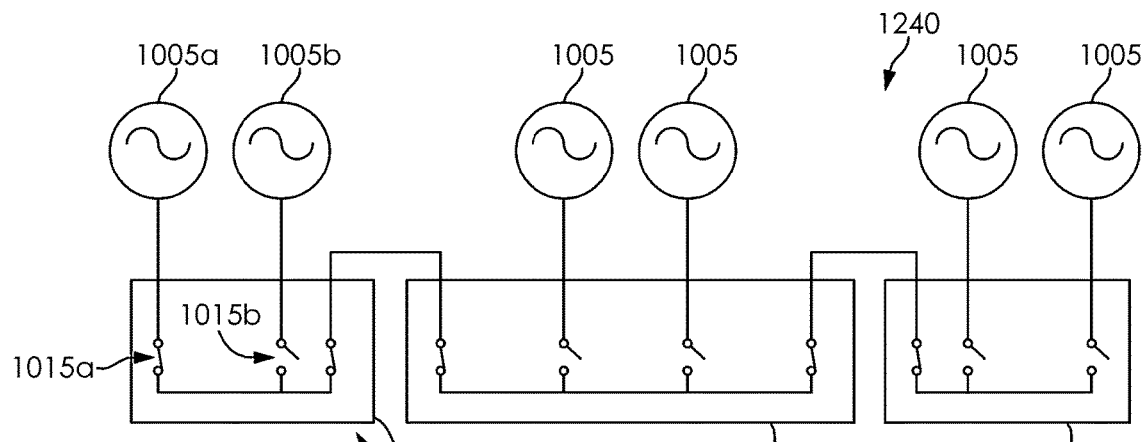
FIG. 9A is a schematic circuit illustration of at least some exemplary embodiments of the present disclosure.
Figure 9B:
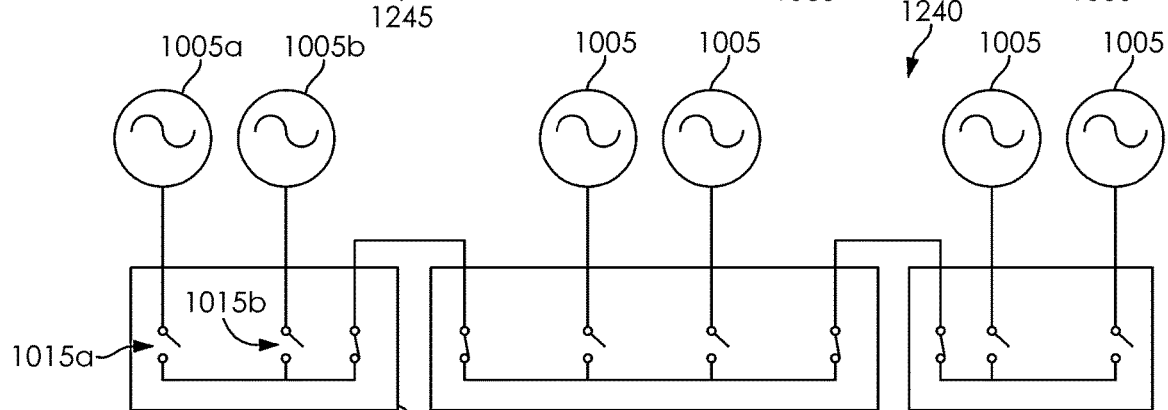
FIG. 9B is a schematic circuit illustration of at least some exemplary embodiments of the present disclosure.
Figure 9C:
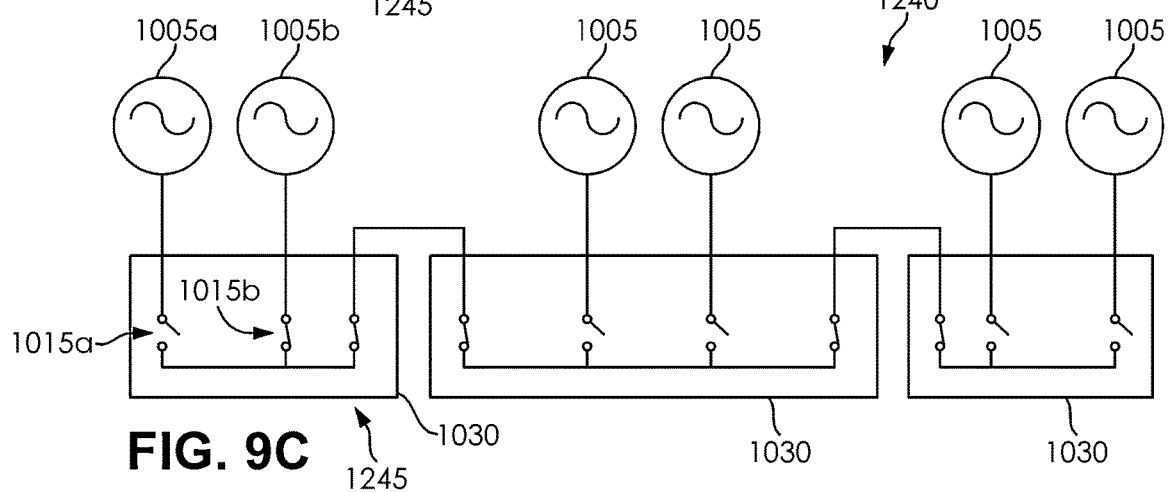
FIG. 9C is a schematic circuit illustration of at least some exemplary embodiments of the present disclosure.

FIGS. 9A-9C illustrate another exemplary embodiment of ZVRT testing 1240 utilizing switching device 1245. In at least some exemplary embodiments, switching device 1245 may include a permanent testing installation or an integrated testing installation. ZVRT testing 1240 may include utilization of power sources 1005 and power sources 1005a and 1005b that may be similar to power source 1005, busses 1030, and protective-isolation devices 1015 and protective-isolation devices 1015a and 1015b that may be similar to protective-isolation devices 1015.

Figure 9D:
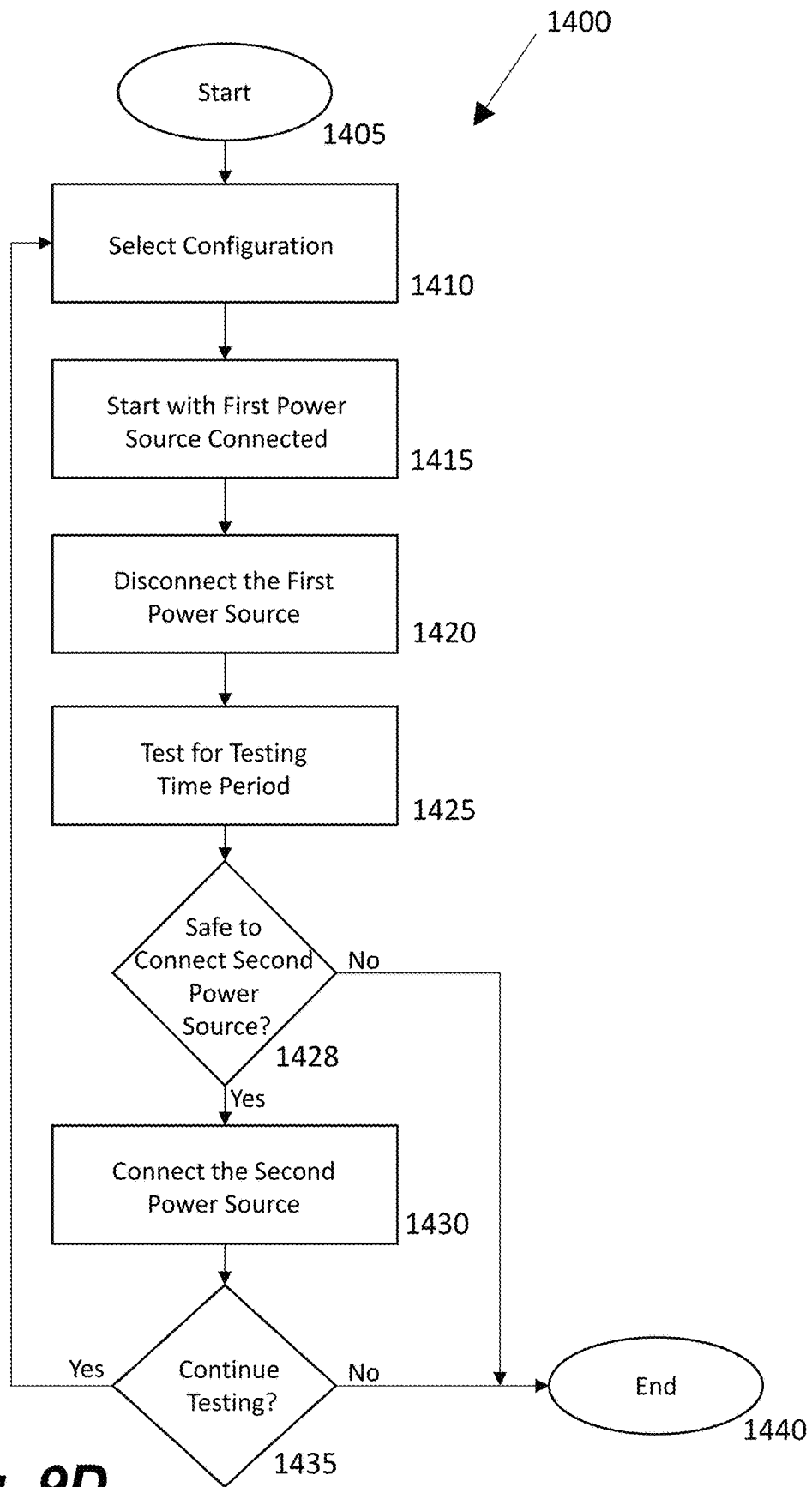
FIG. 9D illustrates an exemplary process of at least some exemplary embodiments of the present disclosure.

FIG. 9D illustrates an exemplary operation of the exemplary disclosed system of FIGS. 9A-9C. Process 1400 may be an electrical testing method. Process 1400 begins at step 1405. At step 1410, ZVRT testing 1240 may be configured for example as illustrated in FIGS. 9A-9C.

At step 1415, ZVRT testing 1240 may start with a first power source (e.g., power source 1005a) operating (e.g., running and at speed) and connected to the system. For example, protective-isolation device 1015a may be closed so that power source 1005a is connected to the system as illustrated in FIG. 9A. Bus ties between busses 1030 may be closed and remain closed during ZVRT testing 1240 as illustrated in FIGS. 9A-9C. Power source 1005b may be operating (e.g., running and at speed) but not connected to the system at step 1415. For example, protective-isolation device 1015b may be open so that power source 1005b is disconnected from the system as illustrated in FIG. 9A. The remaining protective-isolation devices 1015 may remain open during ZVRT testing 1240 so that the remaining power sources 1005 remain disconnected as illustrated in FIGS. 9A-9C. The exemplary disclosed controller (e.g., controller 1020 or a similar controller of electrical system 1000) may use high speed data capture to start (e.g., and continue) recording positions of protective-isolation devices 1015, 1015a, and 1015b and voltage and/or current at desired nodes such as busses 1030, power sources 1005, 1005a, and 1005b, protective-isolation devices 1015, 1015a, and 1015b, and power consumers (e.g., similar to power consumers 1010).

At step 1420, the first power source (e.g., power source 1005a) may be disconnected. For example, protective-isolation device 1015a may be opened so that power source 1005a is disconnected from the system as illustrated in FIG. 9B. The controller (e.g., controller 1020 or a similar controller of electrical system 1000) may start a timer so that the voltage dip of ZVRT testing 1240 occurs for a desired length of time (e.g., a suitable period of time to conduct the exemplary disclosed testing). Testing may occur for the exemplary disclosed time period at step 1425 (e.g., as illustrated in FIG. 9B). The testing time period may be any suitable time period such as between about 0.2 seconds and about 1.0 second, between about 0.4 seconds and about 0.9 seconds, or any other suitable time period. For example, the testing time period may be about 0.4 seconds, about 0.85 second, about 0.87 seconds, or any other suitable time period. When the exemplary time period has elapsed, power source 1005a may be disconnected (e.g., protective-isolation device 1015a may be open) and the remaining power sources (e.g., power source 1005b and power sources 1005) may be disconnected (e.g., protective-isolation device 1015b and protective-isolation devices 1015 may be open). Also when the exemplary testing time period has elapsed, bus voltage may be at zero (e.g., no other power source has closed and/or failed to give a closed indication). For example, the exemplary disclosed system may be in the configuration illustrated in FIG. 9B when the exemplary testing time period ends. If these exemplary conditions are met, process 1400 proceeds to step 1428. At step 1428, the exemplary disclosed system determines whether or not it is suitable (e.g., safe) to connect the second power source (e.g., power source 1015b). The exemplary disclosed system may make this determination by any suitable technique such as, for example, via user input (e.g., via user interface 1025), controller 1020 or a similar controller of electrical system 1000 (e.g., based on a predetermined algorithm and/or predetermined time), machine learning operations for example as described herein, and/or any other suitable criteria. If it is determined not to be safe to connect, process 1400 may end at step 1440. If it is determined to be safe, process 1400 may proceed to step 1430.

At step 1430, if the above conditions described at steps 1425 and 1428 are met and the testing time has elapsed, the second power source (e.g., power source 1015b) may be connected. For example, protective-isolation device 1015b may be opened so that power source 1005b is connected to the system as illustrated in FIG. 9C. The remaining protective-isolation devices 1015 and protective-isolation device 1015a may remain open. Data capture (e.g., by controller 1020 or a similar controller of electrical system 1000) may be stopped after any suitable time (e.g., after a suitable buffer has elapsed).

At step 1435, the exemplary disclosed system may determine whether or not to continue testing based on user input (e.g., via user interface 1025), controller 1020 or a similar controller of electrical system 1000 (e.g., based on a predetermined algorithm and/or predetermined time), machine learning operations for example as described herein, and/or any other suitable criteria. If testing is to be continued, process 1400 may return to step 1410. If testing is not to be continued, process 1400 ends at step 1440.

Figure 10A:
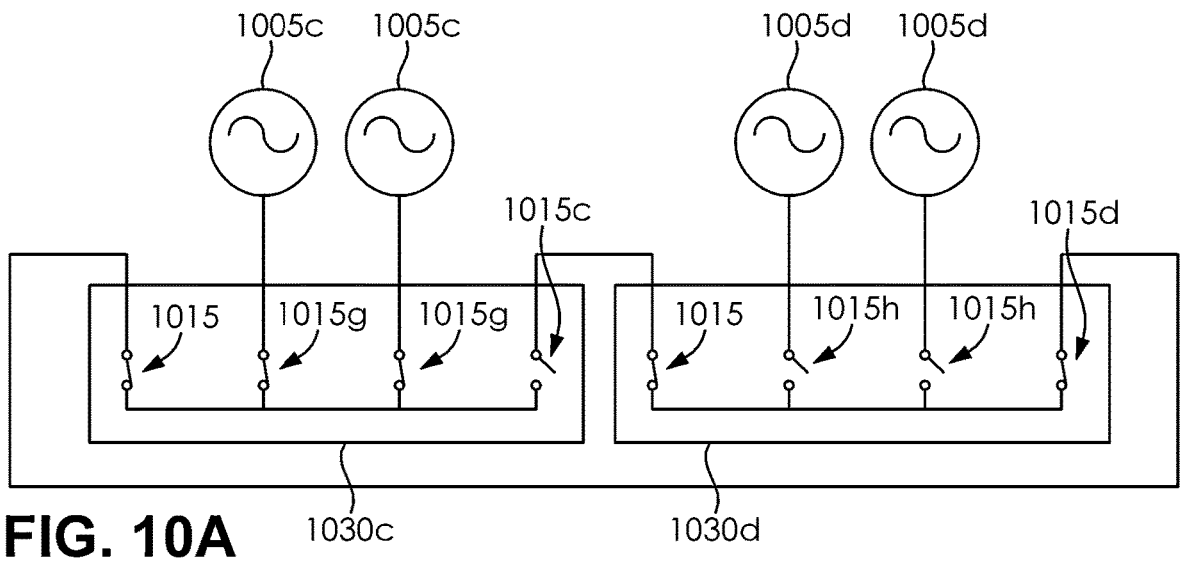
FIG. 10A is a schematic circuit illustration of at least some exemplary embodiments of the present disclosure.
Figure 10B:
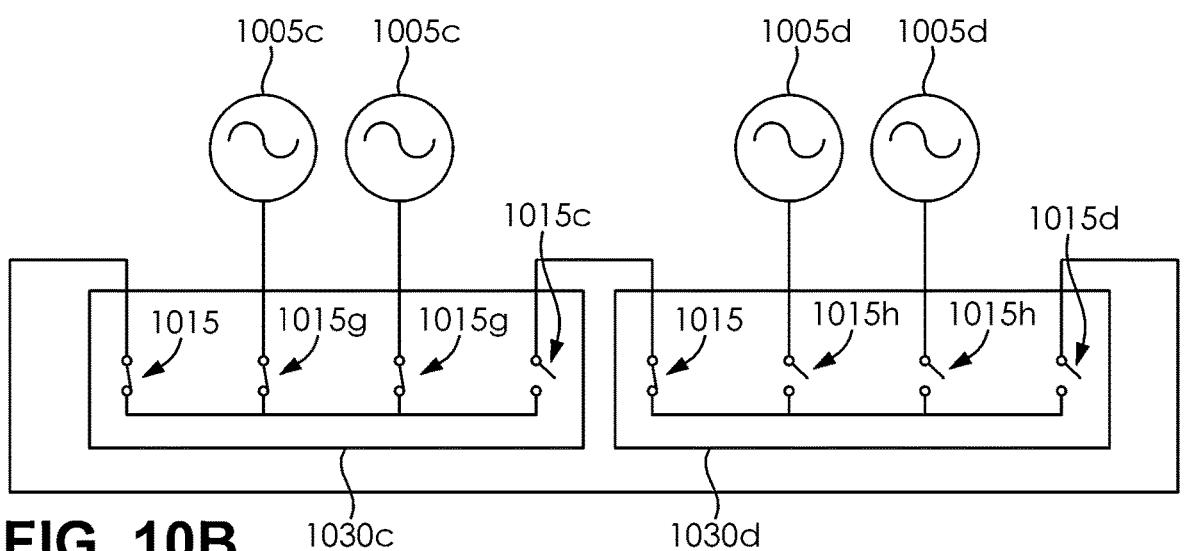
FIG. 10B is a schematic circuit illustration of at least some exemplary embodiments of the present disclosure.
Figure 10C:
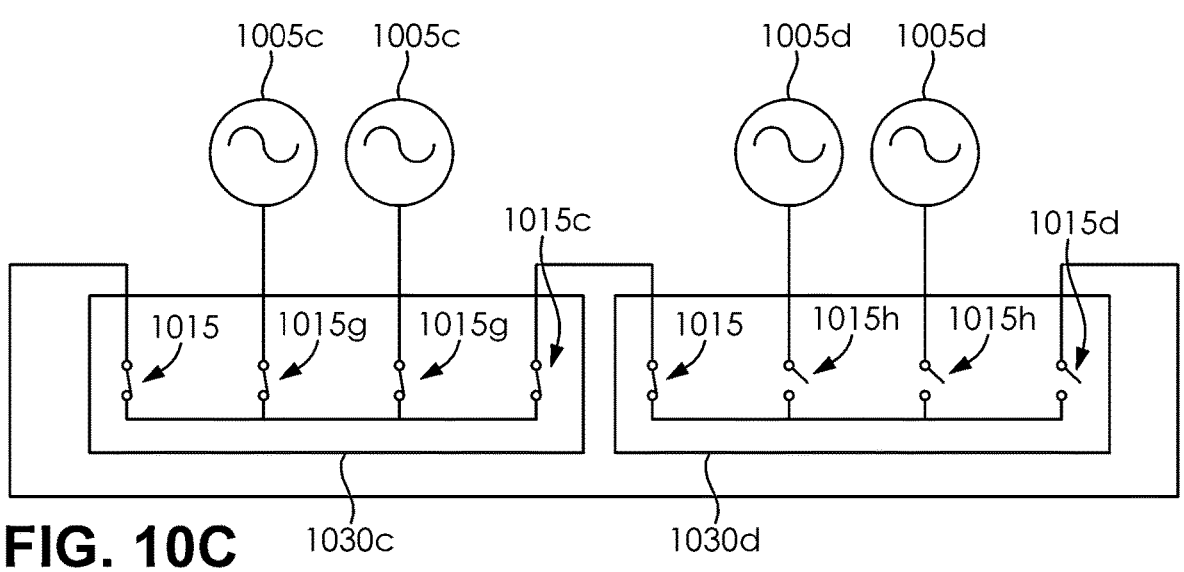
FIG. 10C is a schematic circuit illustration of at least some exemplary embodiments of the present disclosure.

FIGS. 10A-10C illustrate another exemplary embodiment of ZVRT testing 1240. In at least some exemplary embodiments, the exemplary disclosed components may be a permanent testing installation or an integrated testing installation. ZVRT testing 1240 may include utilization of power sources 1005c and 1005d that may be similar to power source 1005, bus 1030c and bus 1030d that may be similar to bus 1030, and protective-isolation devices 1015 and protective-isolation devices 1015c, 1015d, 1015g, and 1015h that may be similar to protective-isolation devices 1015. ZVRT testing 1240 of the exemplary configuration of FIGS. 10A-10C may be performed generally similarly as process 1400.

ZVRT testing 1240 may be configured for example as illustrated in FIGS. 10A-10C. ZVRT testing 1240 may start with one or more power sources of a single bus (e.g., power sources 1005c of bus 1030c) operating (e.g., running and at speed) and connected to the system. For example, protective-isolation devices 1015g may be closed so that power sources 1005c are connected to the system for the duration of the testing as illustrated in FIGS. 10A-10C. Power sources 1005d may not be operating and may be disconnected from the system for the duration of the testing. For example, protective-isolation devices 1015h may be open so that power sources 1005d are disconnected from the system as illustrated in FIGS. 10A-10C. The exemplary disclosed controller (e.g., controller 1020 or a similar controller of electrical system 1000) may use high speed data capture to start (e.g., and continue) recording positions of protective-isolation devices 1015c and 1015d and voltage and/or current at desired nodes such as busses 1030c and 1030d, power sources 1005c and 1005d, protective-isolation devices 1015c and 1015d (e.g., and/or protective-isolation devices 1015g and 1015h), and/or power consumers (e.g., similar to power consumers 1010).

ZVRT testing 1240 may include opening protective-isolation device 1015d as illustrated in FIG. 10B. Testing may begin and be performed during testing time period (e.g., similar to as described above regarding process 1400) in the exemplary configuration illustrated in FIG. 10B. When the testing period has elapsed, protective-isolation devices 1015c and 1015d may be open. Also when the exemplary testing time period has elapsed, bus voltage may be at zero (e.g., no other power source or bus tie has closed and/or failed to give a closed indication). For example, the exemplary disclosed system may be in the configuration illustrated in FIG. 10B when the exemplary testing time period ends. If these conditions described are met and the testing time has elapsed, protective-isolation device 1015c may be closed as illustrated in FIG. 9C. Data capture (e.g., by controller 1020 or a similar controller of electrical system 1000) may be stopped after any suitable time (e.g., after a suitable buffer has elapsed).

ZVRT testing 1240 may involve any suitable configurations. For example, a generator and bus tie combination may also be utilized. Any desired number of busses may be included and tested. ZVRT testing 1240 may test a ride through capability of power sources (e.g., generators) to deliver power and stay connected during short periods of power loss (e.g., lower network voltage) to prevent a short circuit from causing widespread power loss on a system.

Figure 11:
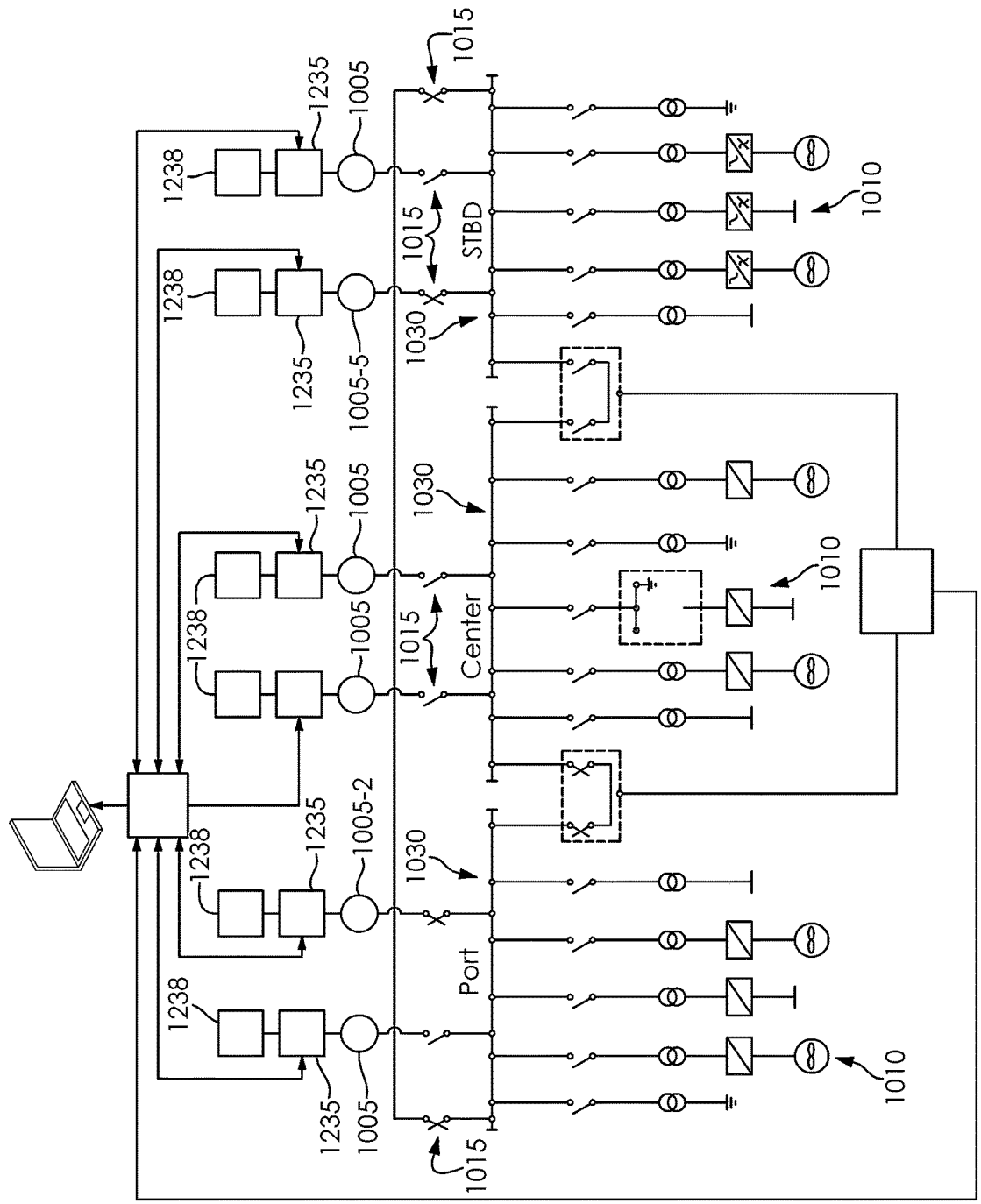
FIG. 11 is a schematic circuit illustration of at least some exemplary embodiments of the present disclosure.

Fault ride through testing 1220 including GVRT testing 1230 and ZVRT testing 1240 may produce a voltage waveform representative of a short circuit event. For example as illustrated in FIG. 11, the following exemplary testing sequence may be performed: power sources 1005-2 and 1005-5 that may be similar to power source 1005 may be running and connected to bus PORT and bus STBD; Bus-tie CENT-STBD is open; Bus-tie PORT-CENT is closed; Bus-tie STBD-PORT is closed; ZeroDip open (e.g., similar to as described above regarding FIGS. 7A-7C and 8A-B) is connected to bus-tie PORT-CENT; ZeroDip close is connected to bus-tie CENT-STBD; GVRTs (e.g., similar to GVRT device 1235) installed on power sources 1005-2 and 1005-5 are selected and ZVRT testing 1240 (e.g., ZeroDip testing) is enabled; a time greater than the longest duration overcurrent opening time of the bus-tie circuit breakers PORT-CENT and CENT-STBD is selected; fault ride through testing 1220 is initiated; GVRTs at power sources 1005-2 and 1005-5 collapse the field of power sources 1005-2 and 1005-5 (e.g., at the same time, the ZeroDip opens bus-tie PORT-CENT); the testing time elapses; and GVRT at power sources 1005-2 and 1005-5 return the fields to their respective generators and ZeroDip closes bus-tie CENT-STBD. Fault ride through testing 1220 including GVRT testing 1230 and ZVRT testing 1240 may thereby verify ride through for isolation times of a closed bus system without the application of a short circuit.

Fault ride through testing 1220 including GVRT testing 1230 and ZVRT testing 1240 may confirm if machines on a network are "stiff" enough to avoid pole slip. For example, the GVRT (e.g., GVRT device 1235) may collapse the field current and cause significant reduction in internal armature voltage $E_A$ and rotor current $I_r$. Fault ride through testing 1220 may also induce fast shifts in load by opening and closing breakers, creating the components that lead to pole slip. For example, switching times of GVRT testing 1230 and ZVRT testing 1240 may begin low (e.g., about 200 ms) and may be slowly increased (e.g., to 800 ms or greater).

The exemplary disclosed system, apparatus, and method may be used in any suitable application involving electrical systems. For example, the exemplary disclosed system, apparatus, and method may be used in any suitable application for performing testing of electrical systems. The exemplary disclosed system, apparatus, and method may be used in any suitable application involving vessels utilizing dynamic positioning. The exemplary disclosed system, apparatus, and method may be used in any suitable application involving maritime vessels (e.g., cable-laying vessels, research vessels, cruise ships), offshore drilling units, and/or any other suitable vessel or movable maritime structure or platform.

In at least some exemplary embodiments, the exemplary disclosed method may be a method for a fault ride through testing of an electrical system including one or more power sources (e.g., power source 1005, 1005a, 1005b, 1005c, and/or 1005d), one or more power consumers (e.g., power consumer 1010), and a first protective-isolation device (e.g., protective-isolation device 1015, 1015a, 1015b, 1015c, and/or 1015d) and a second protective-isolation device (e.g., protective-isolation device 1015, 1015a, 1015b, 1015c, and/or 1015d) both disposed between the one or more power sources and the one or more power consumers. The method may include prior to the fault ride through testing, opening the second protective-isolation device, and closing the first protective-isolation device, and during the fault ride through testing, opening both the first and second protective-isolation devices to block current flow between the one or more power sources and the one or more power consumers. The method may also include during the fault ride through testing, decreasing a terminal voltage of the one or more power sources using a voltage regulator, and following the fault ride through testing, opening the first protective-isolation device, and closing the second protective-isolation device. Decreasing the terminal voltage of the one or more power sources using the voltage regulator may include switching the voltage regulator from a generator field winding of the one or more power sources to an internal resistive inductive load. The method may also include switching the voltage regulator back to the generator field winding and causing the terminal voltage of the one or more power sources to overshoot a nominal voltage of the electrical system. The one or more power sources may include a first power source and a second power source. The first protective-isolation device may be disposed between the first power source and the one or more power consumers. The second protective-isolation device may be disposed between the second power source and the one or more power consumers. The method may further include, prior to the fault ride through testing, running the first power source, which is connected to the one or more power consumers via the closed first protective-isolation device. The method may also include following the fault ride through testing, running the second power source, which is connected to the one or more power consumers via the closed second protective-isolation device. The one or more power consumers may include a first bus and a second bus. The first protective-isolation device may be disposed at the second bus. The second protective-isolation device may be disposed at the first bus and between the one or more power sources and the second bus. The method may also include running the one or more power sources, which is electrically connected to the first bus, prior to, during, and following the fault ride through testing. The electrical system may be a maritime vessel electrical system, the one or more power sources may include one or more generators, and the one or more power consumers may include a thruster or a propeller. The electrical system may be a dynamic positioning system of a maritime vessel or platform.

In at least some exemplary embodiments, the exemplary disclosed method may be a method for testing of an electrical system including a plurality of power sources (e.g., power source 1005, 1005a, 1005b, 1005c, and/or 1005d), one or more power consumers (e.g., power consumer 1010), and a plurality of protective-isolation devices (e.g., protective-isolation device 1015, 1015a, 1015b, 1015c, and/or 1015d) disposed between the plurality of power sources and the one or more power consumers. The method may include performing a fault ride through testing of the electrical system by selectively opening and closing each of the plurality of protective-isolation devices while decreasing a terminal voltage of at least one of the plurality of power sources using a voltage regulator, varying a governor position of one of the plurality of power sources when the plurality of power sources is operating, and inducing an over-excitation event that engages an over-excitation limiter of one of the plurality of power sources and an under-excitation limiter in each of the remaining power sources of the plurality of power sources. The method may also include performing earth fault testing of the plurality of power sources, injecting at least one of controlled currents or voltages into the plurality of protective-isolation devices, injecting a high current low voltage signal into a bus of the one or more power consumers, and operating the one or more power consumers to selectively load the electrical system. The method may also include increasing a voltage of the bus of the one or more power consumers. The method may further include performing testing of the electrical system including at least one selected from the group of phase failure testing, blackout recovery testing, harmonic distortion testing, auditing of protection settings, and combinations thereof. Decreasing the terminal voltage of the at least one of the plurality of power sources using the voltage regulator may include switching the voltage regulator from a generator field winding of the at least one of the plurality of power sources to an internal resistive inductive load. The method may also include switching the voltage regulator back to the generator field winding and causing the terminal voltage of the at least one of the plurality of power sources to overshoot a nominal voltage of the electrical system. The electrical system may be a dynamic positioning system of a maritime vessel or platform, the plurality of power sources may include one or more generators, and the one or more power consumers may include a thruster or a propeller.

In at least some exemplary embodiments, the exemplary disclosed method may be a method for testing of an electrical system including a plurality of power sources (e.g., power source 1005, 1005*a*, 1005*b*, 1005*c*, and/or 1005*d*), one or more power consumers (e.g., power consumer 1010), and a first protective-isolation device (e.g., protective-isolation device 1015, 1015*a*, 1015*b*, 1015*c*, and/or 1015*d*) and a second protective-isolation device (e.g., protective-isolation device 1015, 1015*a*, 1015*b*, 1015*c*, and/or 1015*d*) both disposed between the plurality of power sources and the one or more power consumers. The method may include performing a fault ride through testing of the electrical system including prior to the fault ride through testing, opening the second protective-isolation device, and closing the first protective-isolation device, during the fault ride through testing, opening both the first and second protective-isolation devices to block current flow between the plurality of power sources and the one or more power consumers, during the fault ride through testing, decreasing a terminal voltage of at least one of the plurality of power sources using a voltage regulator, and following the fault ride through testing, opening the first protective-isolation device, and closing the second protective-isolation device. The method may also include inducing an over-excitation event that engages an over-excitation limiter of one of the plurality of power sources and an under-excitation limiter in each of the remaining power sources of the plurality of power sources, and injecting a high current low voltage signal into a bus of the one or more power consumers. The method may also include at least one of varying a governor position of one of the plurality of power sources when the plurality of power sources is operating, or performing earth fault testing of the plurality of power sources. The method may also include at least one of injecting at least one of controlled currents or voltages into the first and second protective-isolation devices, or operating the one or more power consumers to selectively load the electrical system. The method may further include at least one of increasing a voltage of at least one bus of the one or more power consumers, or performing testing of the electrical system including at least one selected from the group of phase failure testing, blackout recovery testing, harmonic distortion testing, auditing of protection settings, and combinations thereof.

The exemplary disclosed system, apparatus, and method may provide an efficient and effective technique for confirming a ride through capability of a vessel or maritime structure such as a platform. For example, the exemplary disclosed system, apparatus, and method may verify a correct isolation and ride through capability of a closed bus system. The exemplary disclosed system, apparatus, and method may confirm a ride through capability of a vessel or maritime structure without using live short circuit testing. The exemplary disclosed system, apparatus, and method may provide a noninvasive technique for confirming a ride through capability that may be safe for personnel and may not damage a vessel being tested. For example, the exemplary disclosed system, apparatus, and method may confirm a ride through capability without negatively affecting, altering an operation, or damaging equipment components of an electrical system being tested.

Figure 12:
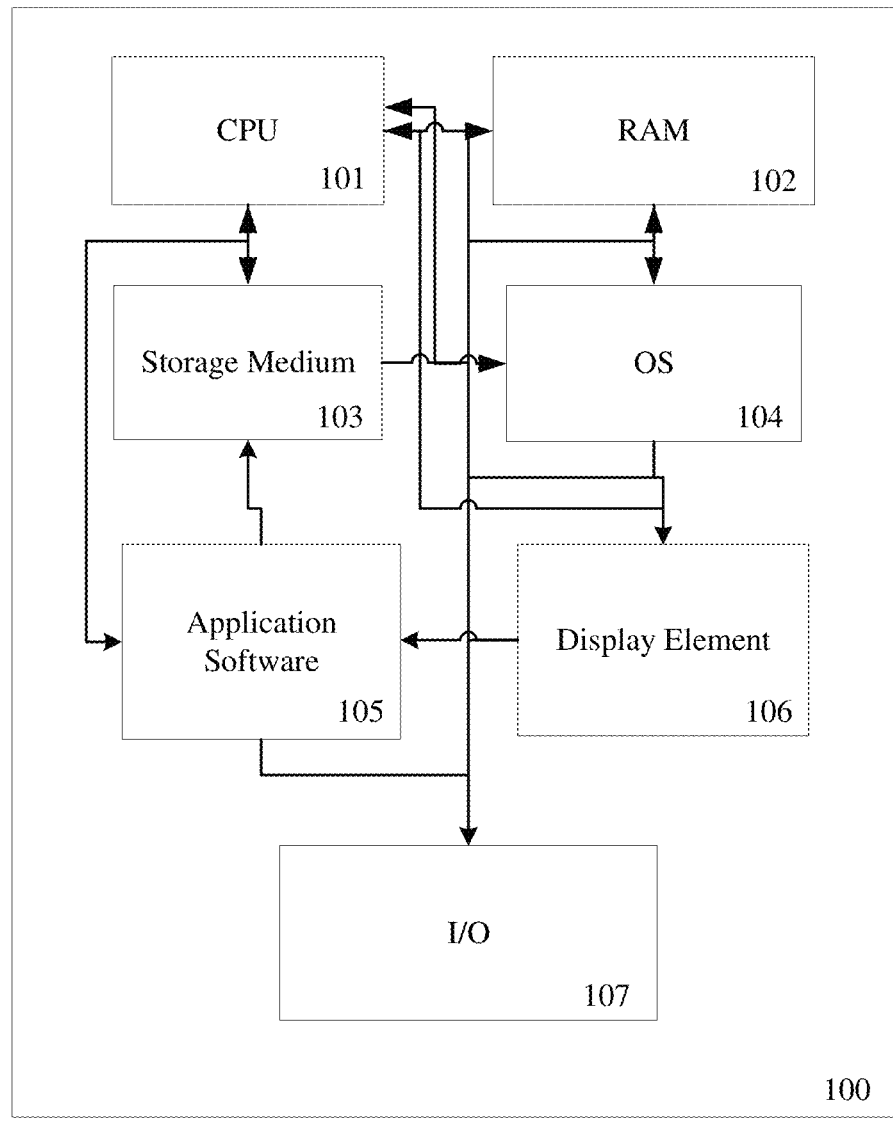
FIG. 12 is a schematic illustration of an exemplary computing device, in accordance with at least some exemplary embodiments of the present disclosure.

An illustrative representation of a computing device appropriate for use with embodiments of the system of the present disclosure is shown in FIG. 12. The computing device 100 can generally be comprised of a Central Processing Unit (CPU, 101), optional further processing units including a graphics processing unit (GPU), a Random Access Memory (RAM, 102), a mother board 103, or alternatively/additionally a storage medium (e.g., hard disk drive, solid state drive, flash memory, cloud storage), an operating system (OS, 104), one or more application software 105, a display element 106, and one or more input/output devices/means 107, including one or more communication interfaces (e.g., RS232, Ethernet, Wifi, Bluetooth, USB). Useful examples include, but are not limited to, personal computers, smart phones, laptops, mobile computing devices, tablet PCs, and servers. Multiple computing devices can be operably linked to form a computer network in a manner as to distribute and share one or more resources, such as clustered computing devices and server banks/farms.

Various examples of such general-purpose multi-unit computer networks suitable for embodiments of the disclosure, their typical configuration and many standardized communication links are well known to one skilled in the art, as explained in more detail and illustrated by FIG. 13, which is discussed herein-below.

According to an exemplary embodiment of the present disclosure, data may be transferred to the system, stored by the system and/or transferred by the system to users of the system across local area networks (LANs) (e.g., office networks, home networks) or wide area networks (WANs) (e.g., the Internet). In accordance with the previous embodiment, the system may be comprised of numerous servers communicatively connected across one or more LANs and/or WANs. One of ordinary skill in the art would appreciate that there are numerous manners in which the system could be configured and embodiments of the present disclosure are contemplated for use with any configuration.

In general, the system and methods provided herein may be employed by a user of a computing device whether connected to a network or not. Similarly, some steps of the methods provided herein may be performed by components and modules of the system whether connected or not. While such components/modules are offline, and the data they generated will then be transmitted to the relevant other parts of the system once the offline component/module comes again online with the rest of the network (or a relevant part thereof). According to an embodiment of the present disclosure, some of the applications of the present disclosure may not be accessible when not connected to a network, however a user or a module/component of the system itself may be able to compose data offline from the remainder of the system that will be consumed by the system or its other components when the user/offline system component or module is later connected to the system network.

Figure 13:
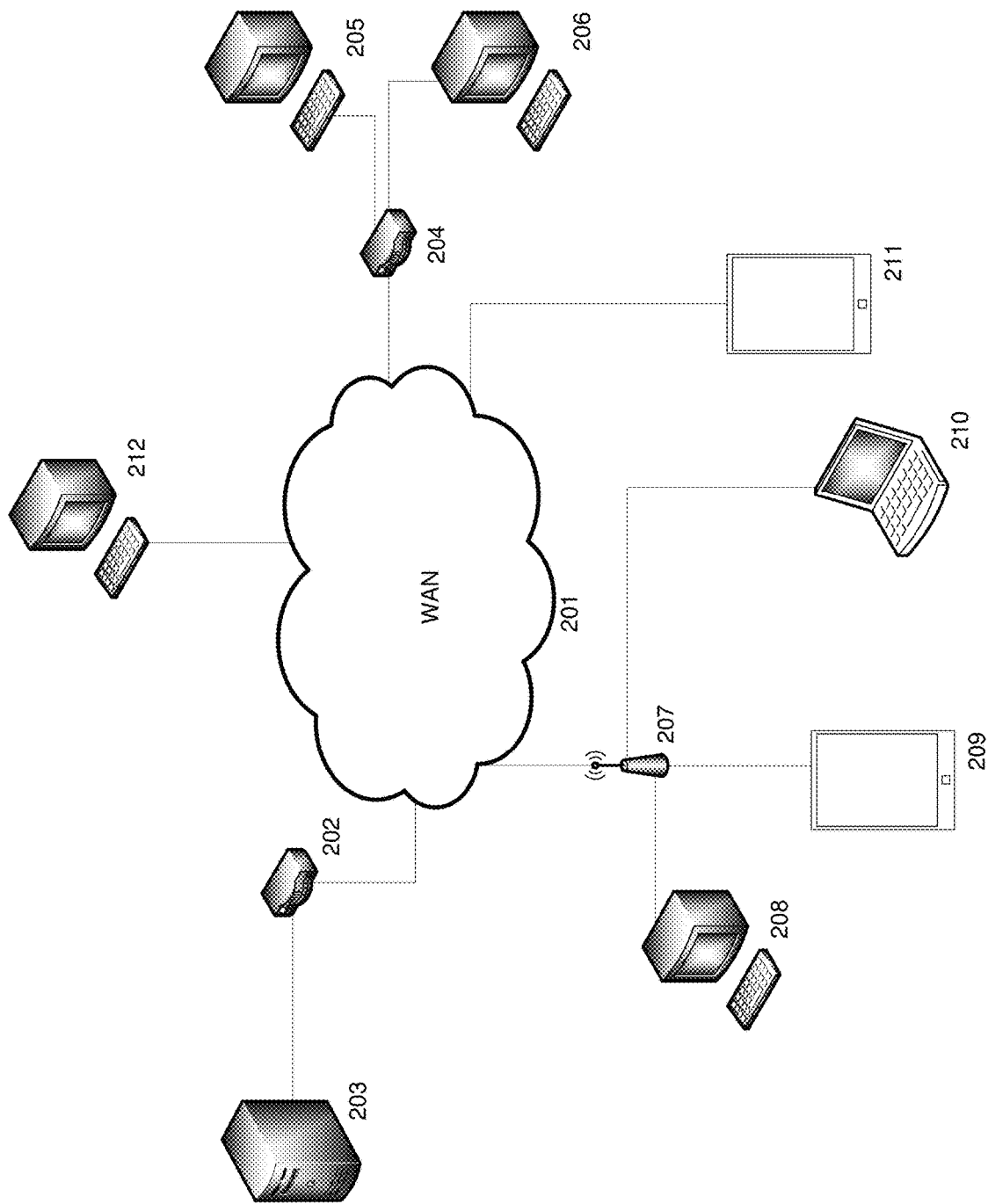
FIG. 13 is a schematic illustration of an exemplary network, in accordance with at least some exemplary embodiments of the present disclosure.

Referring to FIG. 13, a schematic overview of a system in accordance with an embodiment of the present disclosure is shown. The system is comprised of one or more application servers 203 for electronically storing information used by the system. Applications in the server 203 may retrieve and manipulate information in storage devices and exchange information through a WAN 201 (e.g., the Internet). Applications in server 203 may also be used to manipulate information stored remotely and process and analyze data stored remotely across a WAN 201 (e.g., the Internet).

According to an exemplary embodiment, as shown in FIG. 13, exchange of information through the WAN 201 or other network may occur through one or more high speed connections. In some cases, high speed connections may be over-the-air (OTA), passed through networked systems, directly connected to one or more WANs 201 or directed through one or more routers 202. Router(s) 202 are completely optional and other embodiments in accordance with the present disclosure may or may not utilize one or more routers 202. One of ordinary skill in the art would appreciate that there are numerous ways server 203 may connect to WAN 201 for the exchange of information, and embodiments of the present disclosure are contemplated for use with any method for connecting to networks for the purpose of exchanging information. Further, while this application refers to high speed connections, embodiments of the present disclosure may be utilized with connections of any speed.

Components or modules of the system may connect to server 203 via WAN 201 or other network in numerous ways. For instance, a component or module may connect to the system i) through a computing device 212 directly connected to the WAN 201, ii) through a computing device 205, 206 connected to the WAN 201 through a routing device 204, iii) through a computing device 208, 209, 210 connected to a wireless access point 207 or iv) through a computing device 211 via a wireless connection (e.g., CDMA, GMS, 3G, 4G, 5G) to the WAN 201. One of ordinary skill in the art will appreciate that there are numerous ways that a component or module may connect to server 203 via WAN 201 or other network, and embodiments of the present disclosure are contemplated for use with any method for connecting to server 203 via WAN 201 or other network. Furthermore, server 203 could be comprised of a personal computing device, such as a smartphone, acting as a host for other computing devices to connect to.

The communications means of the system may be any means for communicating data, including image and video, over one or more networks or to one or more peripheral devices attached to the system, or to a system module or component. Appropriate communications means may include, but are not limited to, wireless connections, wired connections, cellular connections, data port connections, Bluetooth® connections, near field communications (NFC) connections, or any combination thereof. One of ordinary skill in the art will appreciate that there are numerous communications means that may be utilized with embodiments of the present disclosure, and embodiments of the present disclosure are contemplated for use with any communications means.

Traditionally, a computer program includes a finite sequence of computational instructions or program instructions. It will be appreciated that a programmable apparatus or computing device can receive such a computer program and, by processing the computational instructions thereof, produce a technical effect.

A programmable apparatus or computing device includes one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computing device can include any and all suitable combinations of at least one general purpose computer, special-purpose computer, programmable data processing apparatus, processor, processor architecture, and so on. It will be understood that a computing device can include a computer-readable storage medium and that this medium may be internal or external, removable and replaceable, or fixed. It will also be understood that a computing device can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the disclosure as claimed herein could include an optical computer, quantum computer, analog computer, single board computer, microprocessor, microcontroller, programmable logic controller, field programmable gate array (FPGA), or the like.

Regardless of the type of computer program or computing device involved, a computer program can be loaded onto a computing device to produce a particular machine that can perform any and all of the depicted functions. This particular machine (or networked configuration thereof) provides a technique for carrying out any and all of the depicted functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Illustrative examples of the computer readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A data store may be comprised of one or more of a database, file storage system, relational data storage system or any other data system or structure configured to store data. The data store may be a relational database, working in conjunction with a relational database management system (RDBMS) for receiving, processing and storing data. A data store may comprise one or more databases for storing information related to the processing of moving information and estimate information as well one or more databases configured for storage and retrieval of moving information and estimate information.

Computer program instructions can be stored in a computer-readable memory capable of directing a computer or other programmable data processing apparatus to function in a particular manner. The instructions stored in the computer-readable memory constitute an article of manufacture including computer-readable instructions for implementing any and all of the depicted functions.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the depicted elements and the functions thereof may be implemented as parts of a monolithic software structure, as standalone software components or modules, or as components or modules that employ external routines, code, services, and so forth, or any combination of these. All such implementations are within the scope of the present disclosure. In view of the foregoing, it will be appreciated that elements of the block diagrams and flowchart illustrations support combinations of means for performing the specified functions, combinations of steps for performing the specified functions, program instruction technique for performing the specified functions, and so on.

It will be appreciated that computer program instructions may include computer executable code. A variety of languages for expressing computer program instructions are possible, including without limitation C, C++, Java, JavaScript, assembly language, Lisp, HTML, Perl, Python, and so on. Such languages may include assembly languages, hardware description languages, database programming languages, functional programming languages, imperative programming languages, and so on. In some embodiments, computer program instructions can be stored, compiled, or interpreted to run on a computing device, a programmable data processing apparatus, a heterogeneous combination of processors or processor architectures, and so on. Without limitation, embodiments of the system as described herein can take the form of web-based computer software, which includes client/server software, software-as-a-service, peer-to-peer software, or the like.

In some embodiments, a computing device enables execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. The thread can spawn other threads, which can themselves have assigned priorities associated with them. In some embodiments, a computing device can process these threads based on priority or any other order based on instructions provided in the program code.

Unless explicitly stated or otherwise clear from the context, the verbs "process" and "execute" are used interchangeably to indicate execute, process, interpret, compile, assemble, link, load, any and all combinations of the foregoing, or the like. Therefore, embodiments that process computer program instructions, computer-executable code, or the like can suitably act upon the instructions or code in any and all of the ways just described.

The functions and operations presented herein are not inherently related to any particular computing device or other apparatus. Various general-purpose systems may also be used with programs in accordance with the teachings herein, or it may prove convenient to construct more specialized apparatus to perform the required method steps. The required structure for a variety of these systems will be apparent to those of ordinary skill in the art, along with equivalent variations. In addition, embodiments of the disclosure are not described with reference to any particular programming language. It is appreciated that a variety of programming languages may be used to implement the present teachings as described herein, and any references to specific languages are provided for disclosure of enablement and best mode of embodiments of the disclosure. Embodiments of the disclosure are well suited to a wide variety of computer network systems over numerous topologies. Within this field, the configuration and management of large networks include storage devices and computing devices that are communicatively coupled to dissimilar computing and storage devices over a network, such as the Internet, also referred to as "web" or "world wide web".

In at least some exemplary embodiments, the exemplary disclosed system may utilize sophisticated machine learning and/or artificial intelligence techniques to prepare and submit datasets and variables to cloud computing clusters and/or other analytical tools (e.g., predictive analytical tools) which may analyze such data using artificial intelligence neural networks. The exemplary disclosed system may for example include cloud computing clusters performing predictive analysis. For example, the exemplary neural network may include a plurality of input nodes that may be interconnected and/or networked with a plurality of additional and/or other processing nodes to determine a predicted result. Exemplary artificial intelligence processes may include filtering and processing datasets, processing to simplify datasets by statistically eliminating irrelevant, invariant or superfluous variables or creating new variables which are an amalgamation of a set of underlying variables, and/or processing for splitting datasets into train, test and validate datasets using at least a stratified sampling technique. The exemplary disclosed system may utilize prediction algorithms and approach that may include regression models, tree-based approaches, logistic regression, Bayesian methods, deep-learning and neural networks both as a stand-alone and on an ensemble basis, and final prediction may be based on the model/structure which delivers the highest degree of accuracy and stability as judged by implementation against the test and validate datasets.

Throughout this disclosure and elsewhere, block diagrams and flowchart illustrations depict methods, apparatuses (e.g., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("depicted functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "component", "module," or "system."

While the foregoing drawings and description set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

The functions, systems and methods herein described could be utilized and presented in a multitude of languages. Individual systems may be presented in one or more languages and the language may be changed with ease at any point in the process or methods described above. One of ordinary skill in the art would appreciate that there are numerous languages the system could be provided in, and embodiments of the present disclosure are contemplated for use with any language.

While multiple embodiments are disclosed, still other embodiments of the present disclosure will become apparent to those skilled in the art from this detailed description. There may be aspects of this disclosure that may be practiced without the implementation of some features as they are described. It should be understood that some details have not been described in detail in order to not unnecessarily obscure the focus of the disclosure. The disclosure is capable of myriad modifications in various obvious aspects, all without departing from the spirit and scope of the present disclosure. Accordingly, the drawings and descriptions are to be regarded as illustrative rather than restrictive in nature.

What is claimed is:

1. A method for a fault ride through testing of an electrical system including one or more power sources, one or more power consumers, and a first protective-isolation device and a second protective-isolation device both disposed between the one or more power sources and the one or more power consumers, comprising:
    prior to the fault ride through testing, opening the second protective-isolation device, and closing the first protective-isolation device;
    during the fault ride through testing, opening both the first and second protective-isolation devices to block current flow between the one or more power sources and the one or more power consumers;
    during the fault ride through testing, decreasing a terminal voltage of the one or more power sources using a voltage regulator; and
    following the fault ride through testing, opening the first protective-isolation device, and closing the second protective-isolation device.

2. The method of claim 1, wherein decreasing the terminal voltage of the one or more power sources using the voltage regulator includes switching the voltage regulator from a generator field winding of the one or more power sources to an internal resistive inductive load.

3. The method of claim 2, further comprising switching the voltage regulator back to the generator field winding and causing the terminal voltage of the one or more power sources to overshoot a nominal voltage of the electrical system.

4. The method of claim 1, wherein:
    the one or more power sources includes a first power source and a second power source;
    the first protective-isolation device is disposed between the first power source and the one or more power consumers; and
    the second protective-isolation device is disposed between the second power source and the one or more power consumers.

5. The method of claim 4, further comprising prior to the fault ride through testing, running the first power source, which is connected to the one or more power consumers via the closed first protective-isolation device.

6. The method of claim 4, further comprising following the fault ride through testing, running the second power source, which is connected to the one or more power consumers via the closed second protective-isolation device.

7. The method of claim 1, wherein:
    the one or more power consumers includes a first bus and a second bus;
    the first protective-isolation device is disposed at the second bus; and
    the second protective-isolation device is disposed at the first bus and between the one or more power sources and the second bus.

8. The method of claim 7, further comprising running the one or more power sources, which is electrically connected to the first bus, prior to, during, and following the fault ride through testing.

9. The method of claim 1, wherein the electrical system is a maritime vessel electrical system, the one or more power sources includes one or more generators, and the one or more power consumers includes a thruster or a propeller.

10. The method of claim 1, wherein the electrical system is a dynamic positioning system of a maritime vessel or platform.

11. A method for testing of an electrical system including a plurality of power sources, one or more power consumers, and a plurality of protective-isolation devices disposed between the plurality of power sources and the one or more power consumers, comprising:
    performing a fault ride through testing of the electrical system by selectively opening and closing each of the plurality of protective-isolation devices while decreasing a terminal voltage of at least one of the plurality of power sources using a voltage regulator;
    varying a governor position of one of the plurality of power sources when the plurality of power sources is operating;

inducing an over-excitation event that engages an over-excitation limiter of one of the plurality of power sources and an under-excitation limiter in each of the remaining power sources of the plurality of power sources;

performing earth fault testing of the plurality of power sources;

injecting at least one of controlled currents or voltages into the plurality of protective-isolation devices;

injecting a high current low voltage signal into a bus of the one or more power consumers; and operating the one or more power consumers to selectively load the electrical system.

12. The method of claim 11, further comprising increasing a voltage of the bus of the one or more power consumers.

13. The method of claim 11, further comprising performing testing of the electrical system including at least one selected from the group of phase failure testing, blackout recovery testing, harmonic distortion testing, auditing of protection settings, and combinations thereof.

14. The method of claim 11, wherein decreasing the terminal voltage of the at least one of the plurality of power sources using the voltage regulator includes switching the voltage regulator from a generator field winding of the at least one of the plurality of power sources to an internal resistive inductive load.

15. The method of claim 14, further comprising switching the voltage regulator back to the generator field winding and causing the terminal voltage of the at least one of the plurality of power sources to overshoot a nominal voltage of the electrical system.

16. The method of claim 11, wherein the electrical system is a dynamic positioning system of a maritime vessel or platform, the plurality of power sources includes one or more generators, and the one or more power consumers includes a thruster or a propeller.

17. A method for testing of an electrical system including a plurality of power sources, one or more power consumers, and a first protective-isolation device and a second protective-isolation device both disposed between the plurality of power sources and the one or more power consumers, comprising:

performing a fault ride through testing of the electrical system including prior to the fault ride through testing, opening the second protective-isolation device, and closing the first protective-isolation device, during the fault ride through testing, opening both the first and second protective-isolation devices to block current flow between the plurality of power sources and the one or more power consumers, during the fault ride through testing, decreasing a terminal voltage of at least one of the plurality of power sources using a voltage regulator, and following the fault ride through testing, opening the first protective-isolation device, and closing the second protective-isolation device;

inducing an over-excitation event that engages an over-excitation limiter of one of the plurality of power sources and an under-excitation limiter in each of the remaining power sources of the plurality of power sources; and injecting a high current low voltage signal into a bus of the one or more power consumers.

18. The method of claim 17, further comprising at least one of:

varying a governor position of one of the plurality of power sources when the plurality of power sources is operating; or performing earth fault testing of the plurality of power sources.

19. The method of claim 17, further comprising at least one of:

injecting at least one of controlled currents or voltages into the first and second protective-isolation devices; or operating the one or more power consumers to selectively load the electrical system.

20. The method of claim 17, further comprising at least one of:

increasing a voltage of at least one bus of the one or more power consumers; or performing testing of the electrical system including at least one selected from the group of phase failure testing, blackout recovery testing, harmonic distortion testing, auditing of protection settings, and combinations thereof.

* * * * *